United States Patent [19]

Kosugi et al.

[11] Patent Number: 5,666,324
[45] Date of Patent: Sep. 9, 1997

[54] CLOCK SYNCHRONOUS SEMICONDUCTOR MEMORY DEVICE HAVING CURRENT CONSUMPTION REDUCED

[75] Inventors: Ryuichi Kosugi; Shigeki Ohbayashi, both of Hyogo, Japan

[73] Assignee: Mitsubishi Denki Kabushiki Kaisha, Tokyo, Japan

[21] Appl. No.: 616,386

[22] Filed: Mar. 15, 1996

[51] Int. Cl.$^6$ .................................................. G11C 8/00
[52] U.S. Cl. ......................................... 365/233; 365/233.5
[58] Field of Search ............................ 365/233, 233.5, 365/230.03, 191, 194

[56] References Cited

U.S. PATENT DOCUMENTS

| | | | |
|---|---|---|---|
| 5,077,693 | 12/1991 | Hardee | 365/233 |
| 5,083,296 | 1/1992 | Hara | 365/233 |
| 5,341,341 | 8/1994 | Fukuzo | 365/233 |
| 5,384,750 | 1/1995 | Lee | 365/233 |
| 5,539,693 | 7/1996 | Koshikawa | 365/233 |

FOREIGN PATENT DOCUMENTS

| | | |
|---|---|---|
| 6-162770 | 6/1994 | Japan. |
| 6-203563 | 7/1994 | Japan. |
| 6-333388 | 12/1994 | Japan. |

*Primary Examiner*—David C. Nelms
*Assistant Examiner*—Son Mai
*Attorney, Agent, or Firm*—Lowe, Price, LeBlanc & Becker

[57] ABSTRACT

A synchronous semiconductor memory device includes a clock pulse generator generating internal first and second clock pulses in synchronization with an external clock signal for application, respectively, to a word line select decoder selecting a row of memory cells, and to a bit line select decoder selecting a column of memory cells, a sense amplifier sensing and amplifying a data of selected memory cell and a write driver writing a data to the selected memory cell. Word line select decoder is enabled when the first clock pulse is active, and bit line select decoder, sense amplifier and write driver are activated when the second clock pulse is active. These circuits are activated only for a necessary minimum period, and current consumption is reduced.

15 Claims, 16 Drawing Sheets

FIG. 13
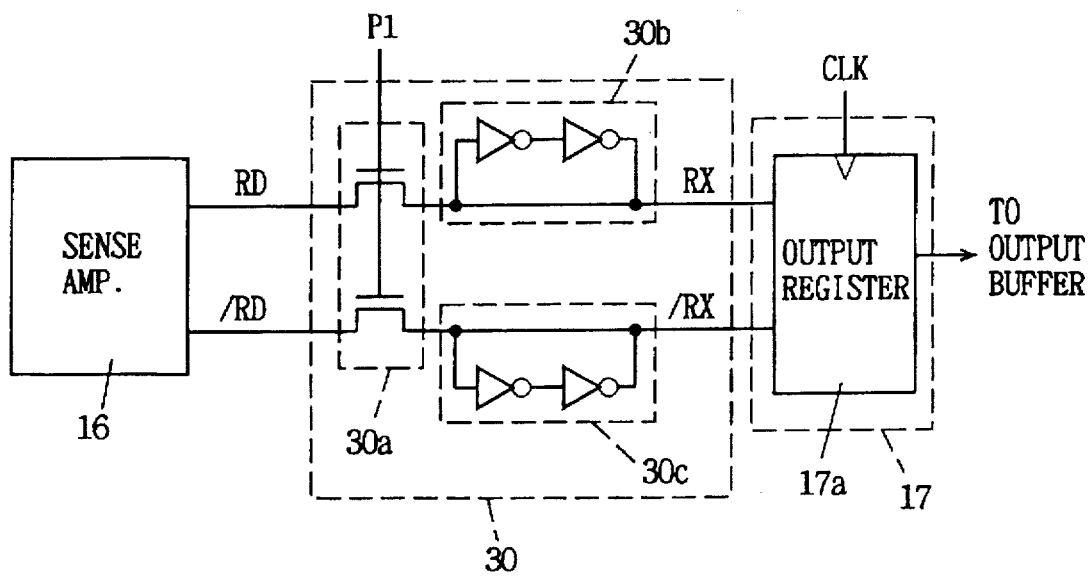
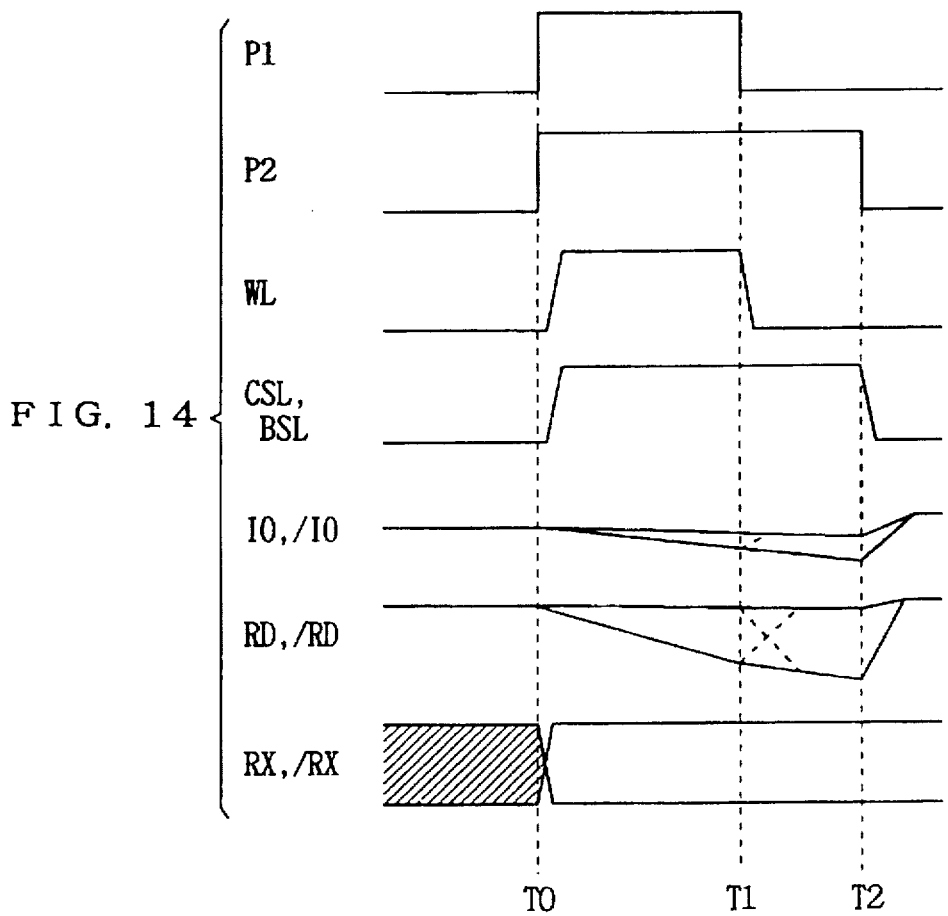
FIG. 14

5,666,324

CLOCK SYNCHRONOUS SEMICONDUCTOR MEMORY DEVICE HAVING CURRENT CONSUMPTION REDUCED

BACKGROUND OF THE INVENTION

1. Field of the Invention

The present invention relates to a clock synchronous semiconductor memory device operating in synchronization with an externally applied clock signal, and more particularly to an arrangement for reducing current consumption in internal data read/write circuitry in the memory device.

2. Description of the Background Art

FIG. 1 schematically shows an overall arrangement of a conventional synchronous pipelined semiconductor memory device. Referring to FIG. 1, the memory device includes a memory array MA grouped into a plurality of (n+1) memory blocks B#0 through B#n each including a plurality of static type memory cells 13 arranged in rows and columns. Word lines 19 are disposed corresponding to respective rows of memory cells 13 and are connected to memory cells 13 on the corresponding rows. Bit line pairs 12 are disposed corresponding to respective columns of memory cells 13 and are connected to memory cells 13 on the corresponding columns. Word line 9 receives a word line drive signal WL at H (logical high) level when selected, and bit line pair 12 transmits complementary data signals BL and /BL.

The memory device further includes a mode register 6 receiving and latching external control signals, or a write mode designation signal ZWE at an input terminal 2 and a chip enable signal ZCE at an input terminal 3 in synchronization with an external clock signal CLK received at a clock input terminal 4, an address register 5 incorporating a multibit address signal Add received at address input terminals 1 in response to an output signal of mode register 6 and the clock signal CLK, a word line select decoder 8 decoding an internal (row) address signal received from address register 5 to select a word line 9 in memory array MA, and local read/write circuits LC# through LC#n provided for respective memory blocks B#0–B#n and reading or writing internal data from or to selected memory cells in corresponding memory blocks B#–B#n in response to an output signal of mode register 6 and an internal (block and column) address signal from address latch 5.

Local read/write circuit LC#i (i=0–n) includes a bit line select decoder 10 decoding the internal address signal to generate a column select signal CSL and a block select signal BSL, a bit line select transfer gates 11 provided for respective bit line pairs 12 to be made conductive in response to column select signal CSL, a sense amplifier 16 receiving and amplifying data signals on internal input/output line pair 15 when activated in response to block select signal BSL and the output signal from mode register, and a write driver 20 for producing internal complementary write data signals onto internal input/output line pair 15 in accordance with an internal write data WD when activated in response to block select signal BSL and the output signal (mode designation signal) of mode register 6.

Bit line select transfer gate 11 includes n channel MOS transistors provided for respective bit lines in a corresponding bit line pair 12. Thus, when a bit line pair is selected, the selected bit line pair is coupled to internal input/output line pair 15 through a bit line select transfer gate 1 made conductive in response to the column select signal CSL at H level.

The memory device further includes a bit line load 14 provided for each bit line pair 12 to clamp a bit line potential BL or /BL at L level upon data reading and to precharge the bit line potentials BL and /BL at H level of power supply voltage Vcc in a standby or non-selected state, a data register 17 provided in common to memory blocks B#0–B#n, for transferring received data in synchronization with the clock signal CLK, and an output buffer 18 receiving an internal read data for outputting to a data input/output terminal 19 when activated in response to an output signal from mode register 6.

Data register 17 receives internal read data RD from a selected sense amplifier (SA) 16 for outputting to output buffer 18 upon data reading and receives external write data at input/output terminal 19 for outputting to write driver 20.

When chip enable signal ZCE is made active to instruct that the memory device (chip) is selected, externally applied address signal Add at address input terminals 1 and write mode designation signal ZWE at control input terminal 2 are latched into address register 5 and mode register 6, respectively, at a rising edge of clock signal CLK. A part of the latched address signal, or X address signal is supplied to word line select decoder 8 to be decoded therein, and a corresponding word line 9 is elected. The remaining of the latched address signal is supplied to bit line select decoder 10 in each of local read/write circuits LC#0–LC#n, to be decoded therein, and a bit line select transfer gate 11 in a selected memory block is made conductive in response to column select signal, and a bit line pair 12 is selected in memory array MA. Thus, a memory cell 13 present at a crossing of the selected word line 9 and the selected bit line pair 12 is selected.

When write mode designation signal ZWE designates a data read mode of operation, data stored in a memory cell 13 connected to the selected word line is read out onto a corresponding bit line pair 12 which in turn is precharged to a predetermined potential by an associated bit line load, and the read out data on the selected bit line pair 12 is transferred to sense amplifier 16 through the conductive bit line select transfer gate 11 and internal input/output line pair 15 in the selected memory block. Sense amplifier 16 in the selected memory block is enabled in response to block select signal BSL and the data read operation mode instructing signal from mode register 6, to amplify the read out data for supplying to data register 17. Data register 17 latches the data received from sense amplifier 16 and transfers the latched data to output buffer 18 in synchronization with a next rising of clock signal CLK. Output buffer 18 is enabled in response to the output signal from mode register 6, to buffer the data received from data register 17 for outputting to input/output terminal 19.

When write mode designation signal ZWE designates a data write mode of operation, data register 17 latches an external write data received through data input/output terminal 19 at the timing of the rising edge of the clock signal CLK at which address signal Add and write mode designation signal ZWE are latched. Write driver 15 in the selected memory block designated by block select signal BSL is activated in response to the output signal from mode register 6, to produce complementary data signals in accordance with internal write data from data register 17 onto the internal input/output line pair 15. Since write driver 15 has a larger current driving ability than bit line load 14, the complementary data signals are written into the selected memory cell 13 through the selected bit line select transfer gate 11 and the associated bit line pair 12.

In the memory device, internal data is transferred by data register 17 in a pipelined manner in synchronization with clock signal.

In a non-pipelined SRAM (static random access memory) in which the data register 17 is not provided, an output of a selected sense amplifier 16 is directly transferred to data input/output terminal 19 in data reading operation, while data at the terminal 19 is directly transferred to a selected write driver 20 and then written into a selected memory cell 13 through a selected bit line select transfer gate 11 and an associated bit line pair 12 in data writing mode of operation. Thus, control of input/output of data by the external clock signal CLK is not required.

FIG. 2 shows a detailed configuration of memory peripheral circuitry in the memory device shown in FIG. 1.

Referring to FIG. 2, memory cell 13 includes an n channel MOS (insulated gate type) transistor (driver transistor) 13-3 having a drain connected to a node NA, a source connected to receive a ground potential GND and a gate connected to a node NB, an n channel MOS transistor (drive transistor) 13-4 having a drain connected to node NB, a source connected to receive the ground potential GND and a gate connected to node NA, an n channel MOS transistor (access transistor) 13-1 responsive to a word line drive signal WL on word line 9 to be conductive for connecting node NA to a bit line 12-1, an n channel MOS transistor (access transistor) 13-2 responsive to word line drive signal WL to be conductive to connect node NB to a bit line 12-2, a resistance element 13-5 of a high resistance connected between node NA and a power supply node Vcc (node and voltage thereof are denoted by same reference character), and a resistance element 13-6 of a high resistance connected between node NB and power supply node Vcc. Driver transistors 13-3 and 13-4 constitutes a flipflop, and data signals are stored at nodes NA and NB. Resistance elements 13-6 and 13-6 act as pull up elements.

Word line select decoder 8 includes a unit decoder 8a provided for each word line 9. Unit decoder 8a includes an NAND circuit 8-1 receiving X address signal bits Ax1–Axn, and an inverter 8-2 receiving and inverting an output signal of NAND circuit 8-1. When received X address signal bits Ax1–Axn are all at H level, NAND circuit 8-1 supplies an output signal at L level, and responsively inverter 8-2 supplies the word line drive signal WL at H level onto word line 9.

Bit line select decoder 10 includes a block decoder 10a receiving and decoding Z (block) address signal bits AYn–AYm to produce a block select signal BSL, and a unit column decoder 10b enabled in response to an inverted block select signal at H level to decode Y column address signal bits AY1–AYl received from address latch for producing a column select signal CSL.

Block decoder 10a is provided commonly to all unit column decoders 10b in a corresponding memory block, and includes an NAND circuit 10-1 receiving Z address signal bits AYn–AYm to produce the block select signal BSL, and inverter 10-3 receiving the block select signal BSL. When all Z address signal bits AYn–AYm are at H level, the memory block is selected, and block select signal BSL goes low.

Unit column decoder 10b is provided for each bit line pair 12, and includes an NAND circuit 10-2 receiving an output signal of inverter 10-3 and Y address signal bits AY1–AYl, and an inverter 10-4 receiving an output signal of NAND circuit 10-2 to produce the column select signal CSL. When block select signal BSL is at L level and all Y address signal bits AY1–AYl are at H level, the column select signal CSL goes high.

Bit line load 14 includes a p channel MOS transistor 14-1 connected between power supply node Vcc and bit line 12-1 and having a gate connected to a ground node, and a p channel MOS transistor 14-2 connected between power supply node and bit line 12-2 and having a gate connected to the ground node. MOS transistors 14-1 and 14-2 serve as load elements.

Sense amplifier 16 includes an inverter 16-1 receiving a read/write mode designation signal R/ZW from mode register 6, a NOR circuit 16-2 receiving an output signal of inverter 16-1 and block select signal BSL, and a current mirror type differential amplifier 16a activated in response to an output signal of NOR circuit 16-2 for differentially amplifying data signals on internal input/output lines 15-1 and 15-2. NOR circuit 16-2 supplies an output signal at H level when read/write mode designation signal R/ZW is at H level indicating a data read operation mode and block select signal BSL is in a selected state at L level.

Differential amplifier 16a includes an n channel MOS transistor 16-3 responsive to the output signal of NOR circuit 16-2 for conducting to form a current flowing path between the power supply node and the ground node, n channel MOS transistors 16-4 and 16-5 for comparing data signals on internal input/output lines 15-1 and 15-2, and p channel MOS transistors 16-6 and 16-7 constituting a current mirror circuit for supplying current flows to MOS transistors 16-4 and 16-5 from the power supply node Vcc.

MOS transistor 16-4 is connected between a node NC and MOS transistor 16-3 and has a gate connected to internal input/output line 15-1. MOS transistor 16-5 is connected between a node ND and MOS transistor 16-3 and has a gate connected to internal input/output line 15-2. MOS transistor 16-6 is connected between the power supply node Vcc and node NC and has a gate connected to node MOS transistor 16-7 is connected between the power supply node Vcc and node ND and has a gate connected to node ND. Internal read out data RD is generated at node ND, and complementary internal read out data/RD is generated at node NC.

Write driver 20 includes an inverter 20-1 receiving internal write data WD from data register 17, a NOR circuit 20-2 receiving block select signal BSL, an output signal of inverter 20-1 and read/write mode designation signal R/ZW, a NOR circuit 20-3 receiving the block select signal BSL, internal write data WD from data register 17 and read/write mode designation signal R/ZW, a three state inverter 20a enabled in response to the output signal of NOR circuit 16-2 to invert an output signal of NOR circuit 20-2 for transmission onto internal data input/output line 15-1, and a three state inverter 20b enabled in response to the output signal of NOR circuit 16-2 to invert an output signal of NOR circuit 20-3 for transmission onto internal data input/output line 15-2.

Three state inverter 20a includes a p channel MOS transistor 20-4 having a source coupled to power supply node Vcc and a gate connected to receive the output signal of NOR circuit 20-2, a p channel MOS transistor 20-5 having a source connected to a drain of MOS transistor 20-4, a gate connected to receive the output signal of NOR circuit 16-2 and a drain connected to internal data input/output line 15-1, and an n channel MOS transistor 20-8 having a drain connected to internal data input/output line 15-1, a gate connected to receive the output signal of NOR circuit 20-2 and a source connected to the ground node.

Three state inverter 20b includes a p channel MOS transistor 20-6 having a source connected to the power supply node and a gate connected to receive the output signal of NOR circuit 20-3, a p channel MOS transistor 20-7 having a source connected to a drain of MOS transistor 20-6, a gate connected to receive the output signal of NOR circuit 16-2 and a drain connected to internal data input/output line 15-2, and an n channel MOS transistor 20-9 having a drain connected to internal data input/output line 15-2, a gate connected to receive the output signal of NOR circuit 20-3 and a source connected to the ground node.

Now, an operation of the circuitry shown in FIG. 2 in reading data will be described with reference to an operation waveform diagram of FIG. 3.

Before time T0, chip enable signal ZCE is set up to L level, and address signal is set up to an address A. At time T0, clock signal CLK rises to H level, and address signal Add and write mode designation signal ZWE are incorporated and latched in the address registers and mode register 6, respectively, at the rising edge of clock signal CLK because hip enable signal ZCE is at L level indicating that the memory device is selected. The latched signals Add and ZWE in the registers 3 and 6 are maintained therein until application of next L level of chip enable signal ZCE (at time T0).

Write mode designation signal ZWE is set to H level at the rising edge of clock signal CLK (at time T0), and data read out operation mode is designated. Responsively, the read/write mode designation signal R/ZW from mode register 6 is brought to H level.

In address signal Add (A), address signal bits Ax1–Axn are applied to NAND circuit 8-1 of each unit decoder 8a in word line select decoder 8. When all address signal bits are at H level, NOT circuit (inverter) 8-2 generates an H level signal onto word line 9, and word line drive signal WL is raised to H level. Responsively, access transistors 13-1 and 13-2 in memory cell 13 turn on to connect the storage nodes NA and NB to bit lines 12-1 and 12-2, respectively. When memory cell stores an H level data, driver transistor 13-3 is in an off state, and node NA is supplied with (positive) electric charges through resistance element 13-5 and is at H level. Driver transistor 13-4 is in an on-state, and node NB is kept at L level through discharging by the conducting driver transistor 13-4.

Potentials on nodes NA and NB are transferred onto bit lines 12-1 and 12-2, and the potential on bit line 12-2 lowers a little from H level precharged by load MOS transistor 14-2 because load MOS transistor 14-2 supplies electric charges to bit line 12-2. Bit line 12-1 is maintained at H level of Vcc.

On the other hand, Z address signal bits AYm–AYn are applied to NAND circuit 10-1 in block decoder 10R, and Y address signal bits AY1–AYl are applied to NAND circuit 10-2 in column decoder 10b. When all the bits AY1–AYn are at H level, block select signal BSL goes low, and column select signal CSL goes high.

Bit line select transfer gate 11 is made conductive in response to column select signal at H level, to connect the bit lines 12-1 and 12-2 with internal data input/output lines 15-1 and 15-2. In a standby state or in a non-selected state with block select signal BSL at H level, NOR circuits 16-2, 20-2 and 20-3 each supply an L level signal, and inverters 20a and 20b are enabled to supply H level signals at power supply potential Vcc onto internal data input/output lines 15-1 and 15-2.

In the data reading operation, inverter 16-1 in sense amplifier 16 supplies an L level signal in response to the signal R/ZW at H level. Therefore, in the selected memory block, the block select signal BSL is at L level, and NOR circuit 162 supplies H level signal to the gates of p channel MOS transistors 20-5 and 20-7. NOR circuits 20-2 and 20-3 supply L level signals to the respective gates of n channel MOS transistors 20-8 and 20-9. Thus, inverters 20a and 20b are brought into output high impedance state.

When bit lines 12-1 and 12-2 are coupled to internal data input/output lines 15-1 and 15-2, the potentials IO and /IO on the lines 15-1 and 15-2 change in accordance with the bit line potentials BL and /BL.

In sense amplifier 16, the output signal of NOR circuit 16-2 is at H level, and MOS transistor 16-2 is turned on to activate differential amplifier 16a. The potential IO is higher than the potential /IO and MOS transistor 16-4 is in a stronger on-state than MOS transistor 16-5 is MOS transistors 16-6 and 16-7 constitute a current mirror circuit and supply current flows of the same magnitude when they are the same in size with each other. Current flowing through MOS transistor 16-5 is smaller than the current flowing through MOS transistor 16-4 and is mirrored by MOS transistors 16-7 and 16-6 to be supplied to MOS transistor 16-4 Thus, the potential /RD at node NC is made lower than the potential RD at node ND. As the current flowing through MOS transistor 16-4 increases, the current flowing through MOS transistor 16-5 decreases, and MOS transistors 16-6 and 16-7 approach off-state. Potential /RD is further decreased, or amplified, and then data signals /RD and RD are latched in data register 17. Data register 17 supplies the latch data signals RD and/RD as read out data Q and at a second rising edge of clock signal CLK at time T1.

At time T1, chip enable signal ZCE is set to L level at the rising edge of clock signal. Address signal Add designates an address A' which in turn is in another memory block, and word line drive signal WL on word line 9 goes low because word line select decoder 8 selects another word line. Block select signal BSL goes high, and NOR circuits 16-2, 20-2 and 20-3 supply H level signals, and the potentials BL, /BL and IO, /IO are precharged by NOT circuits 2a and 2b. In addition, the differential amplifier 16a is deactivated in response to block select signal BSL at H level, and potentials RD and /RD are raised to H level by MOS transistors 16-6 and 16-7. Then, column select signal CSL is made low, and bit line select transfer gate 11 is made non-conductive, and bit lines 12-1 and 12-2 are isolated from internal data input/output lines 15-1 and 15-2. This memory block returns to the standby state, and memory cell selection operation is performed in the other selected memory block.

Now, data writing operation will be described with reference to a waveform diagram of FIG. 4.

Similarly on the data reading operation, when chip enable signal ZCE is set low, address signal Add, write mode designation signal ZWE and external write data D are latched into address register 5, mode register 6 and data register 17, respectively, at the rising edge of clock signal CLK at time T0. If data of L is to be written into a selected memory cell, data of L level is latched in data register 17 and internal write data WD of H level is output from data register 17.

In the data writing operation mode, write mode designation signal ZWE is set at low level at the rising edge of clock signal CLK, and internal read/write mode designation signal R/ZW from mode register 6 is made low.

According to X address signal bits AX1–AXn, word line select driver 8 selects the word line 9, and word line drive signal WL on the selected word line 9 is raised to H level. Responsively, access transistors 13-1 and 13-2 are turned on to connect the storage nodes NA and NB to bit lines 12-1 and 12-2, respectively.

On the other hand, bit line select decoder 10 falls block select signal BSL to L level in accordance with Z address signal bits AYm–AYn, and then raises column select signal CSL to H level in accordance with block select signal BSL and Y address signal bits AY1–AYl.

Bit line select transfer gate 11 is made conductive to connect bit lines 12-1 and 12-2 to internal data input/output lines 15-1 and 15-2 in response to column select signal CSL at H level.

Internal read/write mode designation signal R/ZW is at L level, NOT circuit 16-1 supplies an H level signal, and NOR circuit 16-2 generates an output signal at L level to deactivate the differential amplifier 16a.

In write driver 20, NOT circuit 20-1 supplies an L level signal in response to internal write data WD at H level, NOR circuit 20-2 supplies an output signal at L level in response to the signal R/ZW at L level, the output signal at L level from NOT circuit 20-1 and block select signal BSL at L level, and NOR circuit 20-3 outputs a signal at H level in response to internal write data at H level.

In inverters 20a and 20b, p channel MOS transistors 20-5 and 20-7 are made conductive in response to the L level signal from NOR circuit 16-2, MOS transistors 20-4 and 20-9 are made conductive, and MOS transistors 20-6 and 20-8 are made non-conductive.

Thus, in potentials IO and /IO precharged at Vcc level in a standby on non-selected state, the potential IO is maintained at H level by MOS transistors 20-4 and 20-5, while the potential /IO is discharged to L level of GD ground level by MOS transistor 20-9.

When bit line select transfer gate 11 is made conductive in response to column select signal CSL, the potentials IO and /IO are transferred to bit lines 12-1 and 12-2, and bit line potentials BL and /BL change in accordance with the potentials IO and /IO. Since access transistors 13-1 and 13-2 are in conductive states in response to word line dive signal WL, bit line potentials BL and /BL are transferred to storage nodes NA and NB. More specifically, H level potential (/BL) is transferred to the node NB to turn on driver transistor 13-3, and L level potential (BL) is transferred to the node NA to turn off driver transistor 13-4, and L level data is stored in the selected memory cell.

When chip enable signal ZCE and write mode designation signal ZWE are made low at the next rising edge of clock signal CLK at time T1, data register 17 latches a new write data D' to generate a corresponding internal write data WD (at H level in FIG. 4). Address signal Add is also latched into address register 5, and address signal bits AXY1–AXn and AY1–AYn are generated. This newly applied address signal Add designates an address A' in another memory block, and this selected memory block is brought into non-selected state. That is, word line drive signal WL and column select signal CSL1 are turned to L level, and block select signal BSL is turned to H level. Bit line potentials BL and /BL are charges to H level at Vcc level by bit line load 14, and the input/output line potentials IO and /IO are charged to H level at Vcc level by the inverters 20a and 20b.

In another memory block designated by the address signal Add (A'), memory cell selection operation and data writing operation are performed.

As described above, in the synchronous memory including SRAM (static random access memory), data read or write can be performed in one clock cycle. External signals such as the address signal, the chip enable signal and the write mode designation signal are incorporated and latched at the rising edge of the clock signal, and there is no need for considering the skew of these external signals, and therefore for considering the timing margins of these signals. Thus, internal operation starting timing can be made faster.

However, at least one word line is always in the selected state as far as the memory device (chip) is in the selected or operable state. Under the chip selected (enabled) state, a current flows from bit line load 14 to the ground node through bit line pair 12 and memory cell (including driver transistor). A word line connects a plurality (one row) of memory cells, and the current flowing through memory cells becomes significantly large.

Sense amplifier 16 includes a current mirror type differential amplifier 16a, which in turn causes a current flow from the power supply node to the ground node through the current mirror stage and comparing MOS transistors when activated. Write driver 20 includes three state inverters 20a and 20b of CMOS configuration, and a current flows from bit line load 14, through bit line pair 12, internal data input/output line pair 15 and the conducting n channel MOS transistor in the inverter 20a or 20b supplying L level signal, to the ground node. One of sense amplifier 16 and write driver 20 is always activated as far as the memory device is set into the operable (enabled) state. These current flows are both nonnegligible in view of recent trend of reduction of current consumption of a memory device. Particularly, as the number of data bits is increased, the number of operating sense amplifiers or write drivers is increased, and the current consumption becomes greater accordingly.

SUMMARY OF THE INVENTION

An object of the present invention is to provide a synchronous semiconductor memory device having current consumption reduced.

Another object of the present invention is to provide a synchronous static random access memory device with current consumption in operation reduced.

A synchronous memory device according to the present invention includes a controller for generating a plurality of pulse signals having different pulse widths in synchronization with the external clock signal to activate internal operations.

Preferably, a pulse width of a pulse signal activating a row (word line) selection operation is made shorter than that of pulse signals activating operations of a column (bit line pair) selection and data reading/writing on a selected memory cell.

Internal circuits are activated only in necessary minimum periods in synchronization with the clock signal, and therefore current consumption is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 shows a modification of a data read portion of the semiconductor memory device.

FIG. 14 is a waveform diagram used for explaining a meritorious effect of the arrangement of FIG. 13.

DESCRIPTION OF THE PREFERRED EMBODIMENTS

Figure 5:
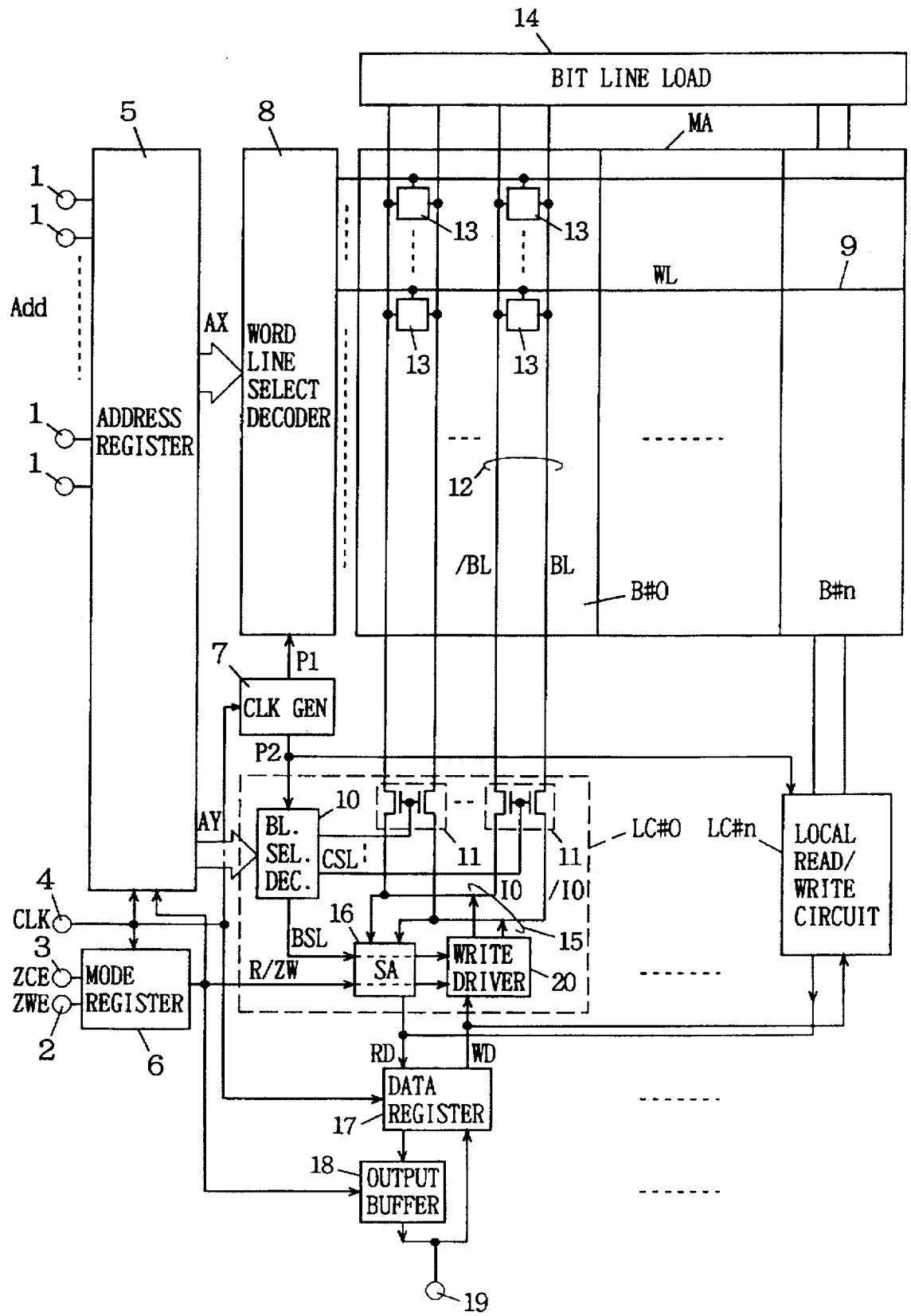
FIG. 5 shows an overall arrangement of a synchronous semiconductor memory device according to an embodiment of the present invention.

FIG. 5 shows an overall arrangement of a synchronous semiconductor memory device according to an embodiment of the present invention.

Figure 1:
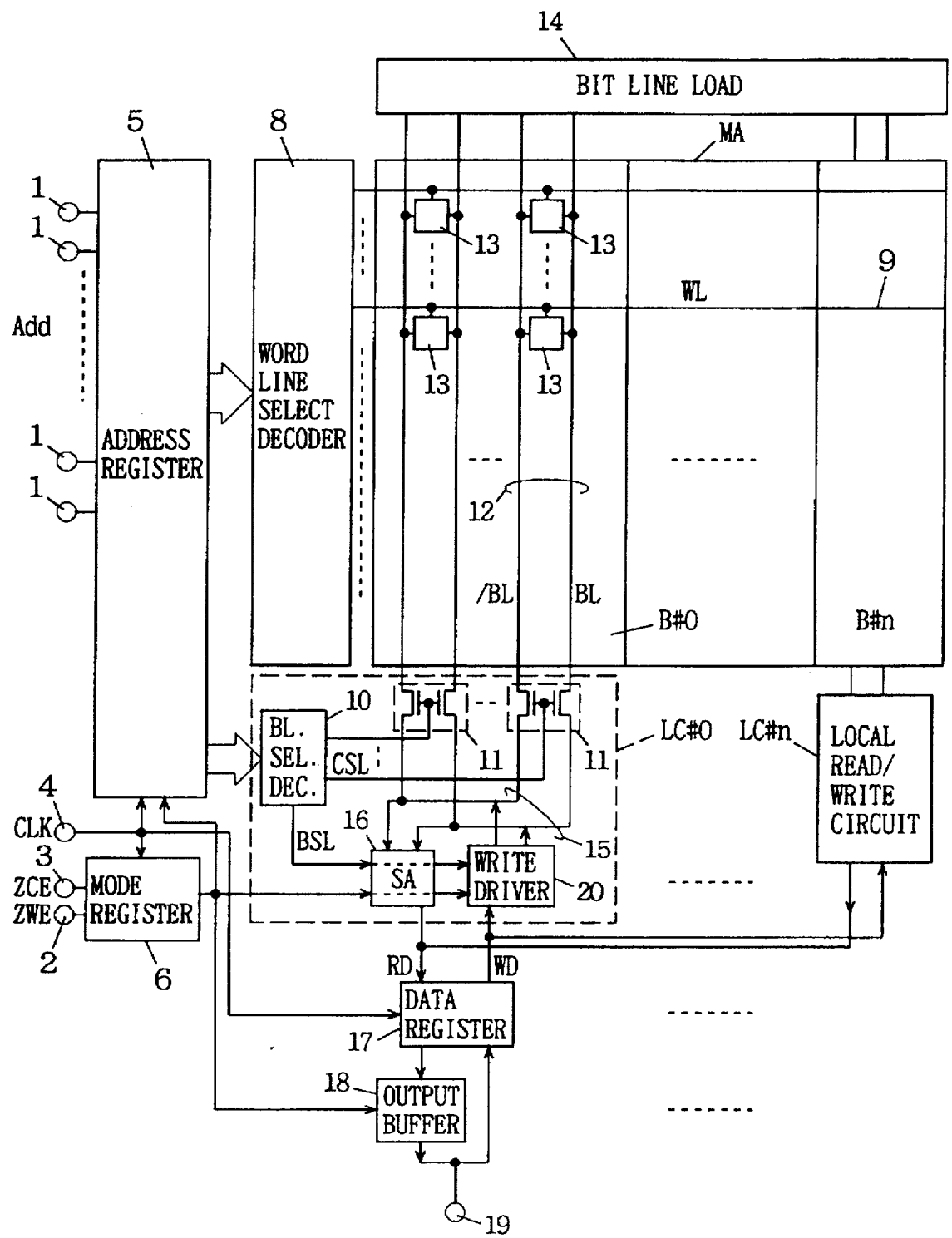
FIG. 1 shows an overall arrangement of a conventional synchronous semiconductor memory device.

Referring to FIG. 5, the memory device includes a plurality of memory blocks B#0–B#n each including memory cells 13 disposed in rows and columns, a plurality of word lines 9 disposed corresponding to respective rows, and a plurality of bit line pairs 12 disposed corresponding to respective columns, as in the arrangement shown in FIG. 1.

The memory device further includes address register 5 incorporating an externally applied address signal to generate internal address signals AX and AY in response to an output signal of mode register 6 and in synchronization with an externally applied clock signal CLK, a word line select decoder 8 receiving and decoding the internal address signal AX to select a word line when activated, a plurality of local read/write circuits LC#0–LC#n provided for respective memory blocks B#0–B#n, for reading or writing data from or to a selected memory cell when activated, a data register 17 for communicating data with an activated local read/write circuit, and an output buffer 18 receiving data from data register 17 for outputting to a data input/output terminal 19.

Local read/write circuits LC#0–LC#n each include a bit line select decoder 10 receiving and decoding the internal address signal AY to produce a block select signal BSL and a column select signal CSL when activated, a column select transfer gate 11 provided for each bit line pair 12, for coupling a corresponding bit line pair 12 to an internal data input/output line pair 15 in response to the column select signal CSL, a sense amplifier 16 responsive to block select signal BSL and a read/write mode designation signal R/ZW for differentially amplifying the potentials IO and /IO on the input/output line pair 15, and a write driver 20 for driving the internal data input/output line pair 15 in response to an internal write data WD when activated.

The memory device further includes a clock pulse generator (CLK GEN) 7 receiving the external clock signal CLK to generate a plurality of internal clock pulses having different pulse widths (active periods) from each other. The internal clock pulses are activated in synchronization with an activation (rising) of the clock signal CLK and are deactivated internally in predetermined times.

In FIG. 5, clock pulse generator 7 supplies a clock pulse P1 to word line select decoder 8 and another clock pulse P2 to bit line select decoder 10 in each local read/write circuit LC#0–LC#n. Active periods of these decoders 8 and 10 are determined by the activation periods of clock pulses P1 and P2. Now, operation of the memory device will be described briefly.

When chip enable signal ZCE is set at low level to designate a chip select state, multibit address signal Add at address input terminals 1 and write mode designation signal ZWE are latched into address register 5 and mode register 6, respectively at the rising edge of clock signal CLK.

Clock generator 7 normally operates to generate a plurality of kinds of clock pulses in accordance with the received clock signal CLK.

Word line select decoder 8 is enabled in response to internal clock pulse P1 to decode internal address signal AX to drive an addressed word line (row) 9 into a selected state.

Bit line select decoder 10 is enabled in response to clock pulse P2 to decode internal address signal AY to drive a column select signal CSL for an addressed column into a selected (H level) state to turn on a corresponding bit line select transfer gate 11. Thus, a memory cell 13 on the selected word line 9 and the selected bit line pair 12 is selected.

In data reading, sense amplifier 16 is activated in response to internal read/write mode designation signal R/ZW, to amplify the data of the selected memory cell 13 received through bit line pair 12 and internal input/output line pair 15 for outputting to data register 17. At the next rising of clock signal CLK, data register 17 transfers the latched data to output buffer 18, which in turn supplies the read out data at data input/output terminal 19.

In data writing, write driver 20 is activated in response to the internal read/write mode designation signal R/ZW and block select signal BSL and drives the selected bit line pair 12 into a state corresponding to external write data at the terminal 19 through internal input/output line pair 15 and bit line select transfer gate 11 in accordance with internal write data WD received from data register Activation period of word line drive signal WL, or enabling period of word line select decoder 8 is determined by the active period, or pulse width of clock pulse P1, while activation period of column select signal CSL and block select signal BSL, or enabling period of bit line select decoder 10 is determined by the active period of clock pulse P2. Thus, appropriate selection of the active periods of clock pulses P1 and P2 will reduce the current consumption in the enabled memory device because memory cell 13, sense amplifier 16 and write driver 20 are brought into non-selected states at appropriate timings in a clock cycle.

Figure 6:
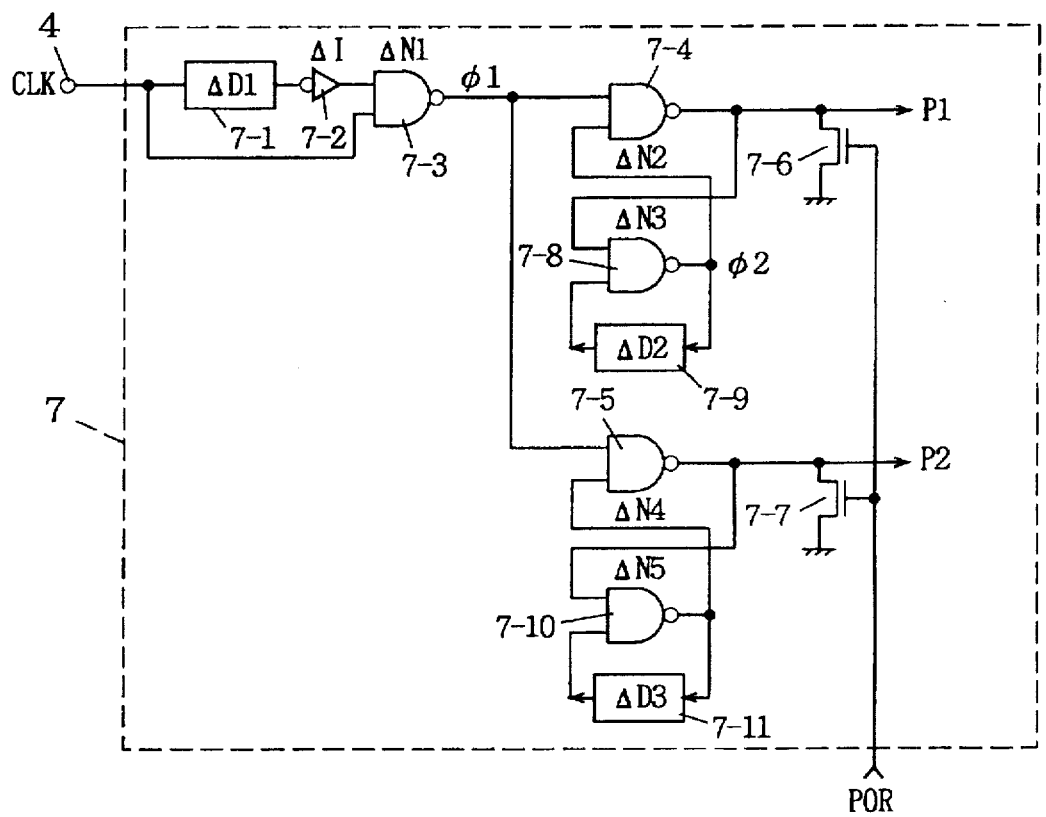
FIG. 6 specifically shows a configuration of the clock pulse generator shown in FIG. 5.

FIG. 6 specifically shows a configuration of clock pulse generator 7 shown in FIG. 5. Referring to FIG. 6, clock pulse generator 7 includes a delay circuit 7-1 delaying the clock signal CLK received through the clock input terminal 4 by a delay time ΔD1, a NOT circuit 7-2 receiving and inverting an output signal of delay circuit 7-2, and an NAND circuit 7-3 receiving and performing a negative logical product operation on an output signal of NOT circuit 7-2 and clock signal CLK. NOT circuit 7-2 has a delay time of ΔI, and NAND circuit 7-3 has a delay time of ΔN1. NAND circuit 7-3 supplies an output signal φ1 going low in response to the rise of clock signal CLK.

Clock pulse generator 7 further includes cross-coupled NAND circuits 7-4 and 7-8, a delay circuit 7-9 delaying an output signal φ2 of NAND circuit 7-8 by ΔD2 for transmission to one input of NAND circuit 7-8, cross-coupled NAND circuits 7-5 and 7-10, and a delay circuit 7-11 delaying an output signal of NAND circuit 7-10 by a delay time of ΔD3.

NAND circuit 7-4 receives the output signal φ1 at one input and the output signal φ2 at another input to produce the clock pulse P1, and has a delay time of ΔN2. NAND circuit 7-8 receives the clock pulse P1 at another input, and has a delay time of ΔN3.

NAND circuit 7-5 receives the output signal φ1 at one input and an output signal of NAND circuit 7-10 to perform NAND operation thereon to produce the clock pulse P2, and has a delay time of ΔN4. NAND circuit 7-10 receives the clock signal P2 at one input and an output signal of delay circuit 7-11, and has a delay time of ΔD3.

Clock pulse generator 7 further includes a reset transistor 7-6 formed of n channel MOS transistor responsive to a power on reset signal POR for resetting the clock pulse P1 to L level, and a reset transistor 7-7 formed of an n channel MOS transistor responsive to power on reset signal POR for resetting the clock pulse P2 to L level.

Power on reset signal POR is made high for a predetermined time upon application of power supply voltage Vcc, and is generated by a well known circuit as disclosed in Japanese Patent Laying-Open No. 7-24379, for example. Now, an operation of the clock pulse generator 7 will be described with reference to an operating waveform diagram of FIG. 7.

Upon application of power supply voltage, power on reset signal POR is made high for a predetermined time to turn on reset transistors 7-6 and 7-7, and clock pulses P1 and P2 are initialized to L level. This operation is not represented in FIG. 7.

After the power supply voltage Vcc is stabilized, clock signal CLK rises at time T0. At this time, the output signal of NOT circuit 7-2 is still at H level, and output signal φ1 of NAND circuit goes low at time T0+ΔN1 due to the gate delay of NAND circuit 7-3.

After the elapse of time ΔD1+ΔI since the rising of clock signal CLK, the output signal of inverter 7-2 goes low, and responsively NAND circuit 7-3 renders the output signal φ1 high at time T0+ΔN1+ΔD1+ΔI. Thus, the output signal φ1 is made low for the time of ΔD1+ΔI.

The clock pulse P1 is initialized to L level, and the output signal φ2 and the output signal of delay circuit 7-9 are at H level still at this time. In response to the fall of the output signal φ1, the clock pulse P1 goes high through NAND circuit 7-4 at time T0+ΔN1+ΔN2, and then the output signal φ2 goes low through NAND circuit 7-3 at time T0+ΔN1+ΔN2+ΔN3.

After the elapse of delay time of ΔD2 of delay circuit 7-9 since the falling of the output signal φ2, the output signal of delay circuit 7-9 goes low, and responsively the output signal φ2 of NAND circuit 7-8 goes high. Thus, the output signal φ2 is kept low for a time of ΔD2+ΔN3. When the output signal φ2 goes high, the clock pulse P1 goes low after the elapse of time ΔN2. Thus, the clock pulse P1 is kept high for a time of ΔN2+2·ΔN3+ΔD2.

On the other hand, when the output signal φ1 goes low at time T0+ΔN1, the clock pulse P2 goes high through NAND circuit 7-5 at time T0+ΔN1+ΔN4. In response to the rise of clock pulse P2, the output signal of delay circuit 7-11 goes low after the elapse of time of ΔN5+ΔD3, and then the output signal of NAND circuit 7-10 goes high after the elapse of time ΔN5.

In response to the rise of the output signal of NAND circuit 7-10, NAND circuit 7-5 receives H level signals a both inputs to bring the clock pulse P2 into L level after the elapse of a time of ΔN4 since the rise of the output signal of NAND circuit 7-10. Thus, the clock pulse P2 is kept high for a time of ΔN4+2·ΔN5+ΔD3.

Figure 7:
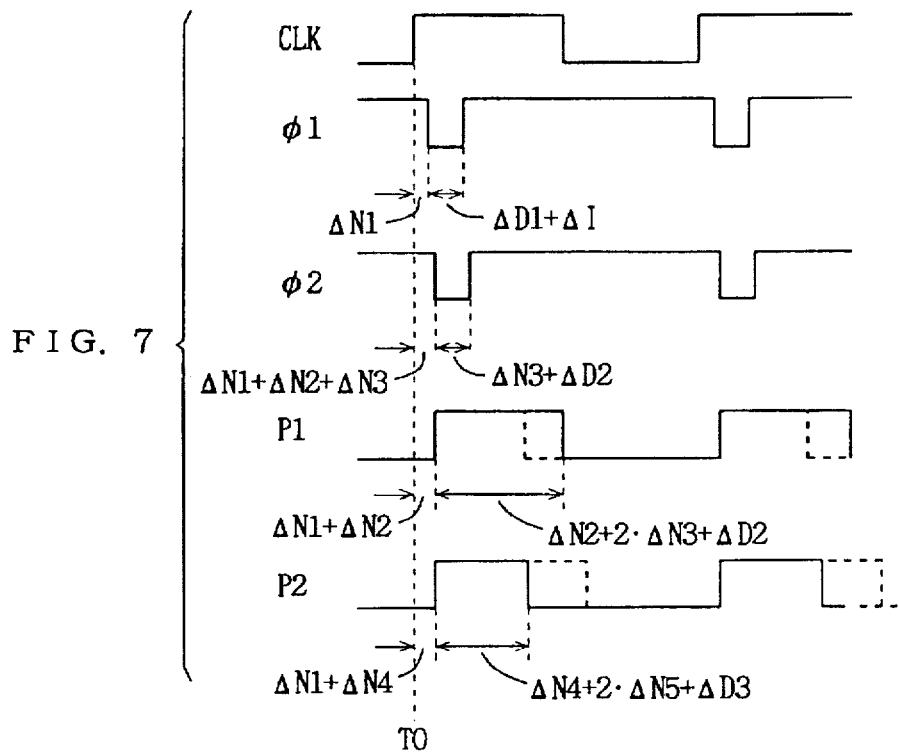
FIG. 7 is a waveform diagram representing an operation of the clock pulse generator shown in FIG. 6.

When delay circuits 7-9 and 7-11 each are formed of cascaded inverters of an even number of stages, the number of stages of inverters in a delay circuit 7-9 is made smaller than that in delay circuit 7-11 in practice, and the delay time ΔD2 of delay circuit 7-9 is made shorter than the delay time ΔD3 of delay circuit 7-11, that is, the active period of clock pulse P1 is made shorter than the active period of clock pulse P2 as shown by the dotted lines in FIG. 7, for the reason described later.

Figure 8A:
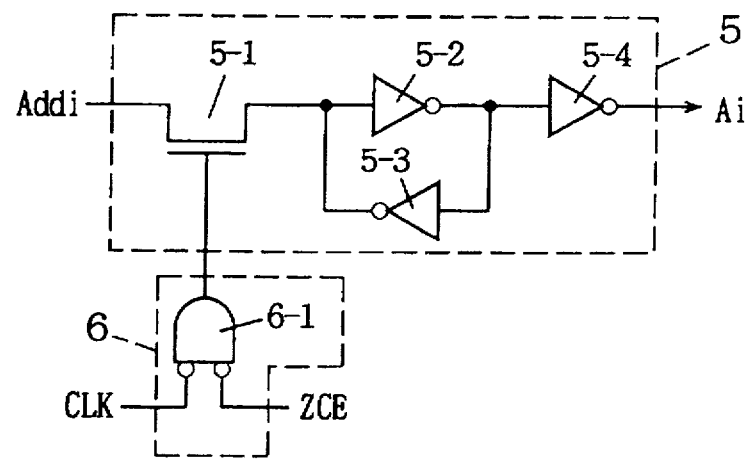
FIG. 8A shows a specific example of the address register shown in FIG. 5.

FIG. 8A shows a schematic arrangement for one address signal bit Addi of the address register 5 and a configuration of mode register 6 for address latch control. The detailed configuration of mode register will be described later.

Referring to FIG. 8A, mode register 6 includes a NOR circuit 6-1 receiving the clock signal CLK and chip enable signal ZCE.

Figure 8B:
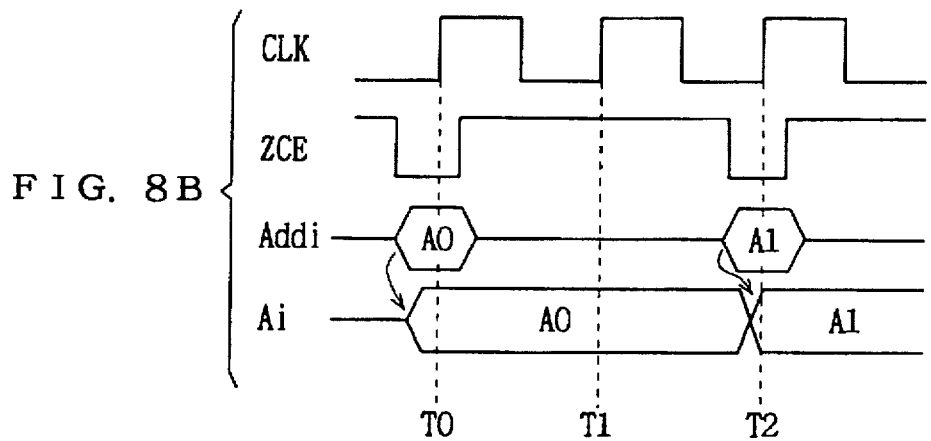
FIG. 8B is a timing chart representing an operation of the address register.

Address register 5 includes a transfer gate 5-1 formed of an n channel MOS transistor for example and responsive to an output signal of NOR circuit 6-1 for transferring an address signal bit Addi, NOT circuits 5-2 and 5-3 constituting a latch for latching a signal received from transfer gate 6-1, and a NOT circuit 5-4 receiving and inverting an output signal of NOT circuit 5-2 to generate an internal address signal bit Ai. Now, operation of the arrangement of FIG. 8A will be described with reference to an operation waveform diagram of FIG. 8B.

Before time T0, chip enable signal ZCE is made low, an address signal bit Addi is applied and set up. Clock signal CLK is at L level, and transfer gate 5-1 is made conductive, and address signal bit Addi is transferred through transfer gate 5-1 to be latched by NOT circuits 5-2 and 5-3.

When clock signal CLK goes high at time T0, transfer gage 5-1 is made non-conductive, and the address signal bit Addi is latched. When chip enable signal ZCE goes high, the output signal of NOR circuit 6-1 is kept low.

When chip enable signal ZCE is set high at the rising edge of clock signal CLK at time T1, the output signal of NOR circuit 6-1 is at L level, and transfer gate 6-1 is kept non-conductive, and the address signal bit Ai is kept unchanged.

When chip enable signal ZCE is set at L level before the rising edge of clock signal CLK at time T2, the output signal of NOR circuit 6-1 goes low to make transfer gate conductive, and a new address signal bit A1 is incorporated into the address register 5.

When clock signal CLK rises at time T2, the transfer gate 5-1 is made non-conductive, and the address signal bit Ai (A1) is latched.

Figure 9:
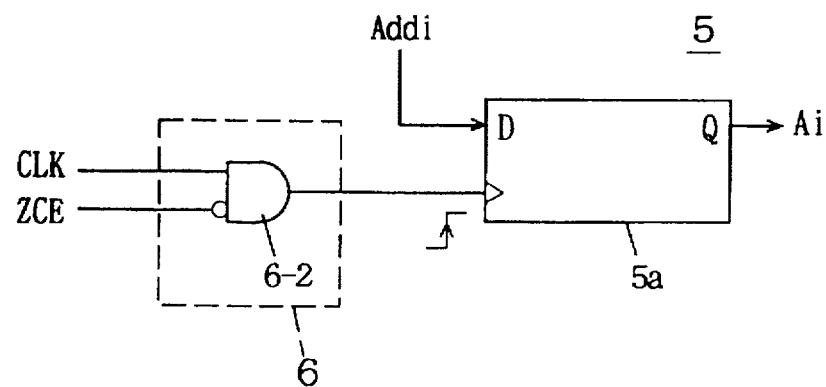
FIG. 9 shows another structure of address register of FIG. 5.

FIG. 9 shows another arrangement of address register of one bit. In FIG. 9, mode register 6 includes a logic gate 6-2 receiving the clock signal CLK at a true input and chip enable signal ZCE at a false input.

Address register 5 includes an up-edge trigger type register 5a having a clock input receiving the clock signal CLK, a signal input D receiving the address signal bit Addi, and a signal output Q outputting the internal address signal bit Ai.

The register 5a has a well known internal configuration, and incorporates and latches the bit Addi at signal input D in response to the rising of the output of logic gate 6-2. Logic gate 6-2 has the output signal raised to H level at the rising of clock signal CLK while the chip enable signal ZCE is at L level. Thus, the address signal bit Addi is incorporated and latched into the address register 5 at the rising edge of clock signal when chip enable signal ZCE is at L level.

Data register 17 has a configuration similar to the address register 5 except that a latch timing signal therefor is produced by the combination of clock signal CLK, chip enable signal ZCE and write mode designation signal ZWE. A specific configuration of mode register will be described later.

Figure 10:
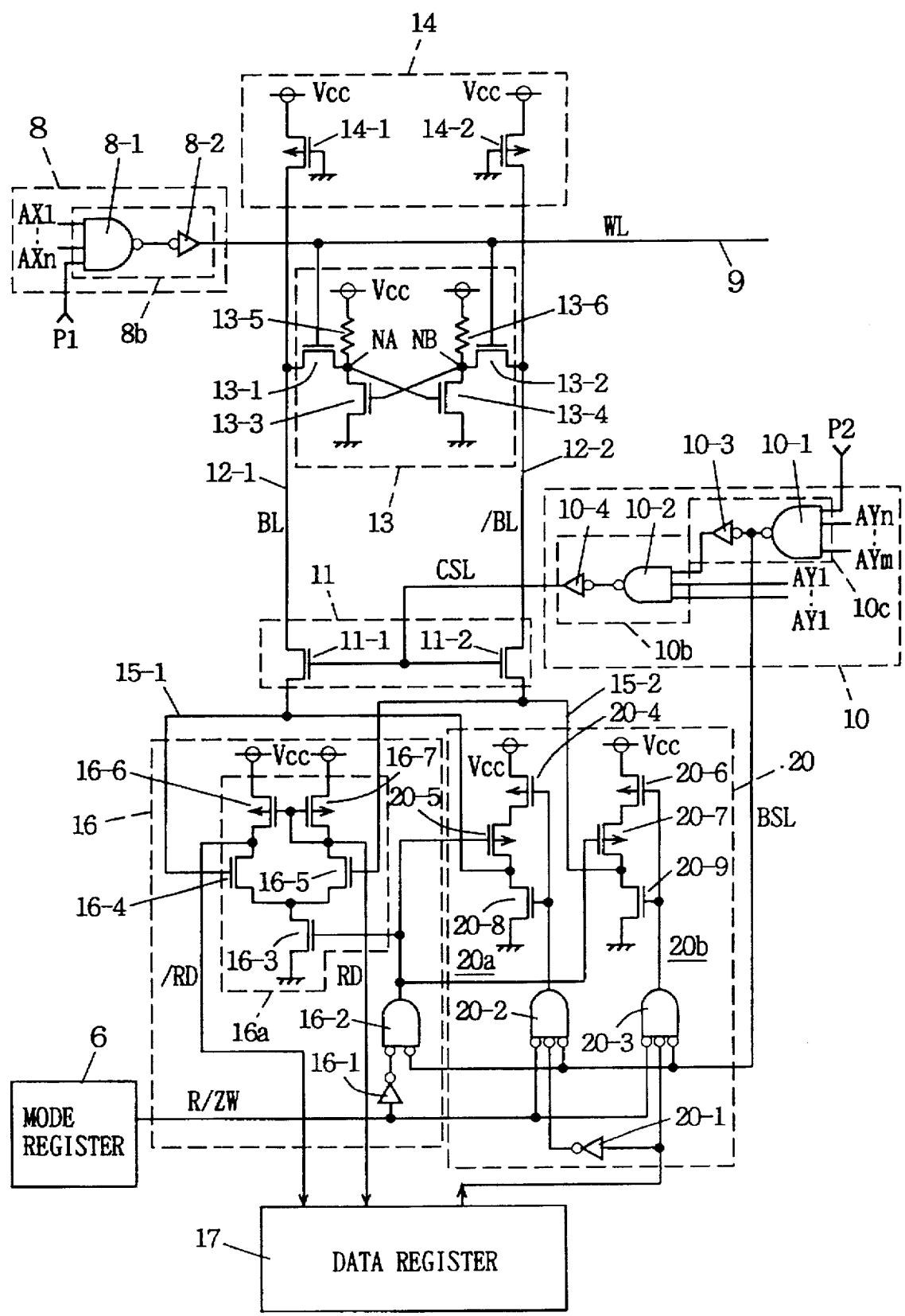
FIG. 10 shows a main portion of the semiconductor memory device of FIG. 5 in detail.

FIG. 10 shows a detailed configuration of a memory cell and peripheral circuitry of the memory device of FIG. 5.

Referring to FIG. 10, word line select decoder 8 includes a unit decoder 8b provided for each word line 9 and enabled in response to internal clock signal P1 to decode row address bits AX1–AXn for driving a corresponding word line 9 into a selected state. Unit decoder 8b includes a NAND circuit 8-1 receiving address signal bits AX1–AXn and internal clock signal P1, and a NOT circuit 8-2 to drive a word line drive signal WL in accordance with the output signal of NAND circuit 8-1. When the address signal bits AX1–AXn and internal clock signal P1 are all at H level, the word line 9 is selected. Combination of logics of address signal bits is uniquely determined for each respective word line 9, and when all the address signal bits AX1–AXn are not at H level, another word line is designated. NAND circuit 8-1 is enabled only when internal clock signal P1 is at H level, and therefore activation period of word line drive signal WL is determined by H period or activation period of internal clock pulse P1.

Bit line select decoder 10 includes a block decoder 10 provided for each memory block and receiving block address signal bits AYm–AYn and internal clock signal P2 to produce a block select signal BSL, and a unit column decoder 10b provided for each bit line pair 12 and receiving the block select signal BSL from block decoder and column address signal bits AY1–AYl to produce and supply a column select signal CSL to bit line select transfer gate 11.

Block decoder 10c includes a NAND circuit 10-1 receiving block address signal bits AYm–AYn and internal clock signal P2 to produce block select signal BSL, and a NOT circuit 10-3 receiving block select signal BSL for inversion.

Unit column decoder 10b includes a NAND circuit 10-2 receiving an output signal of NOT circuit 10-3 and column address signal bits AY1–AYl, and a NOT circuit 10-4 receiving an output signal of NAND circuit 10-2 to produce the column select signal CSL.

NAND circuit 10-1 is enabled when internal clock pulse P2 is activated, or at H level, and therefore the activation period, or L level period of block select signal BSL is determined by internal clock pulse P2.

Figure 2:
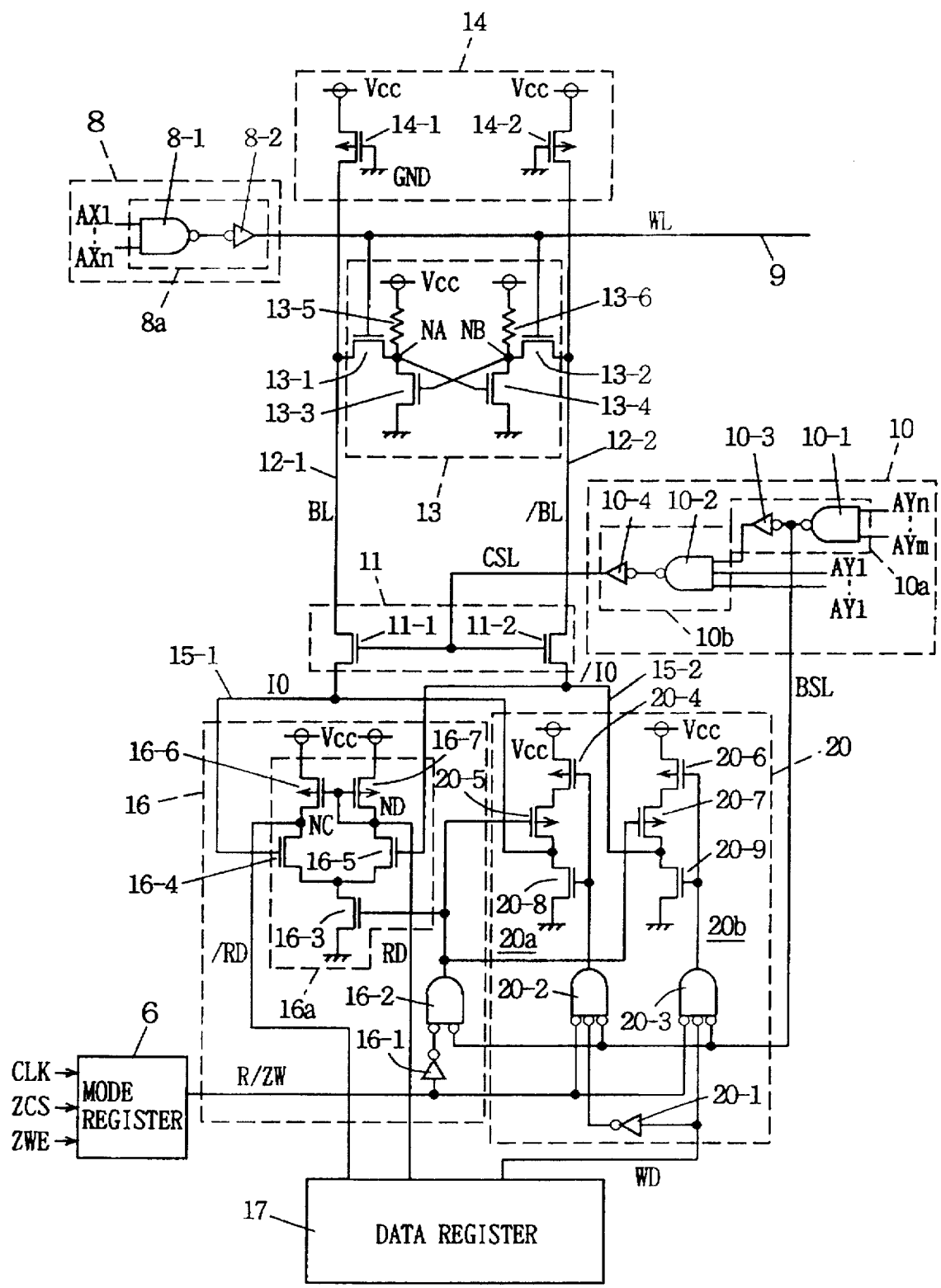
FIG. 2 shows a main portion of the memory device of FIG. 1 in detail.
Figure 3:
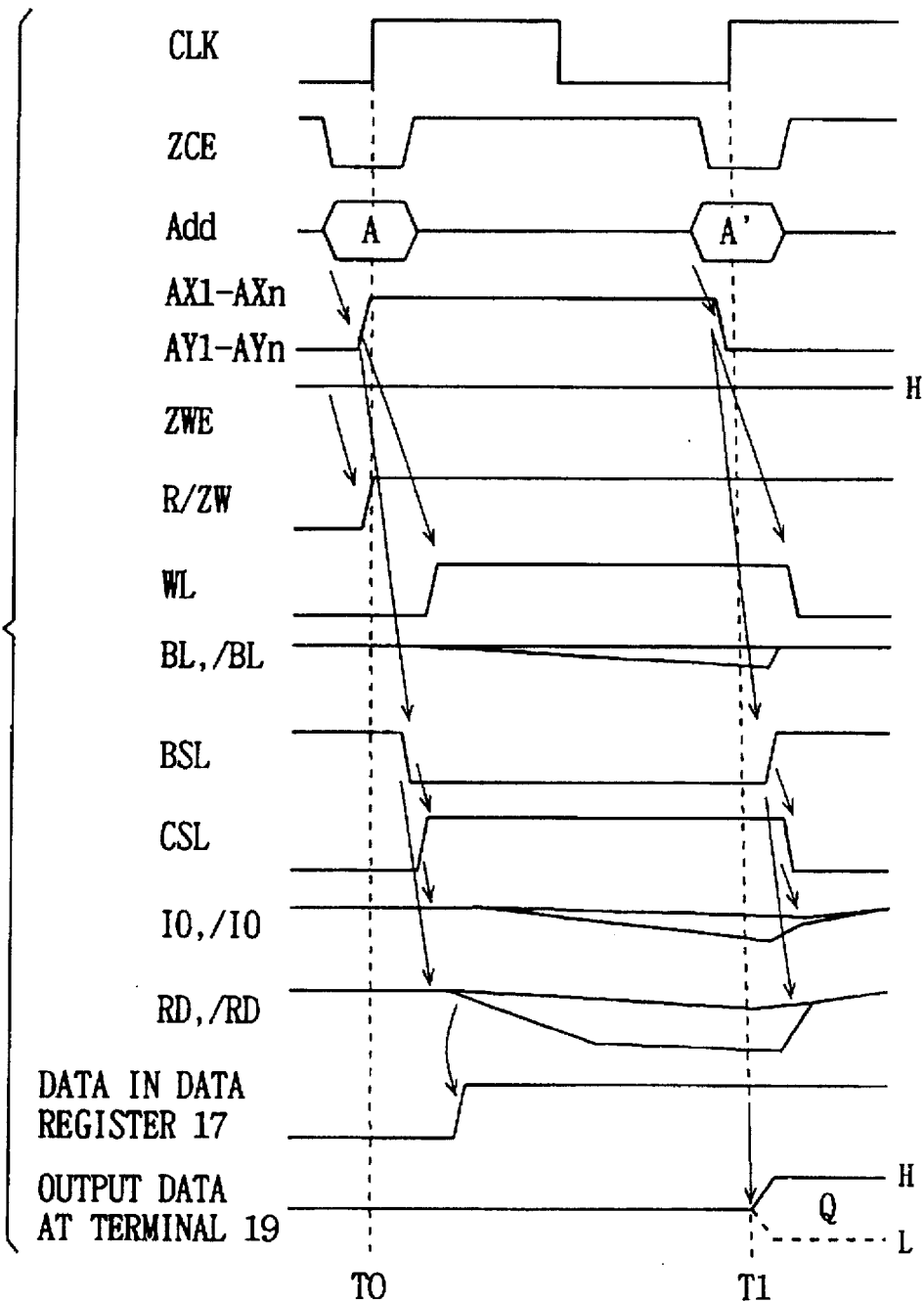
FIG. 3 is a waveform diagram representing a data read operation of the memory device of FIG. 2.
Figure 4:
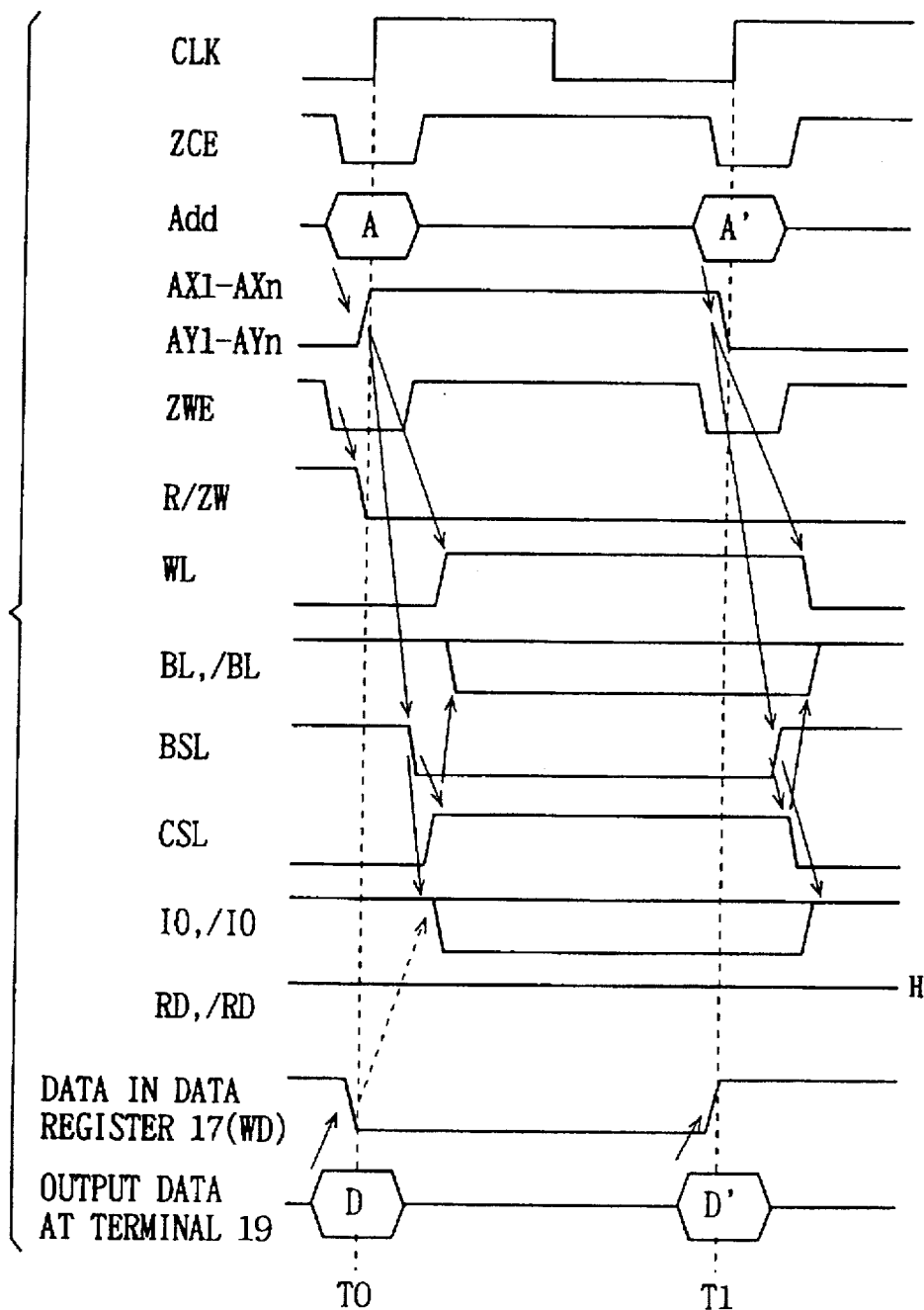
FIG. 4 is a waveform diagram representing a data write operation of the memory device of FIG. 2.

Bit line load 14, memory cell 13, bit line select transfer gate 11, sense amplifier 16 and write driver 20 each have a configuration similar to that shown in FIG. 2, and like reference numerals or characters are denoted to like components. Now, operation of the memory device according to the present invention will be described with reference to operation waveform diagrams of FIGS. 11 and 12.

Figure 11:
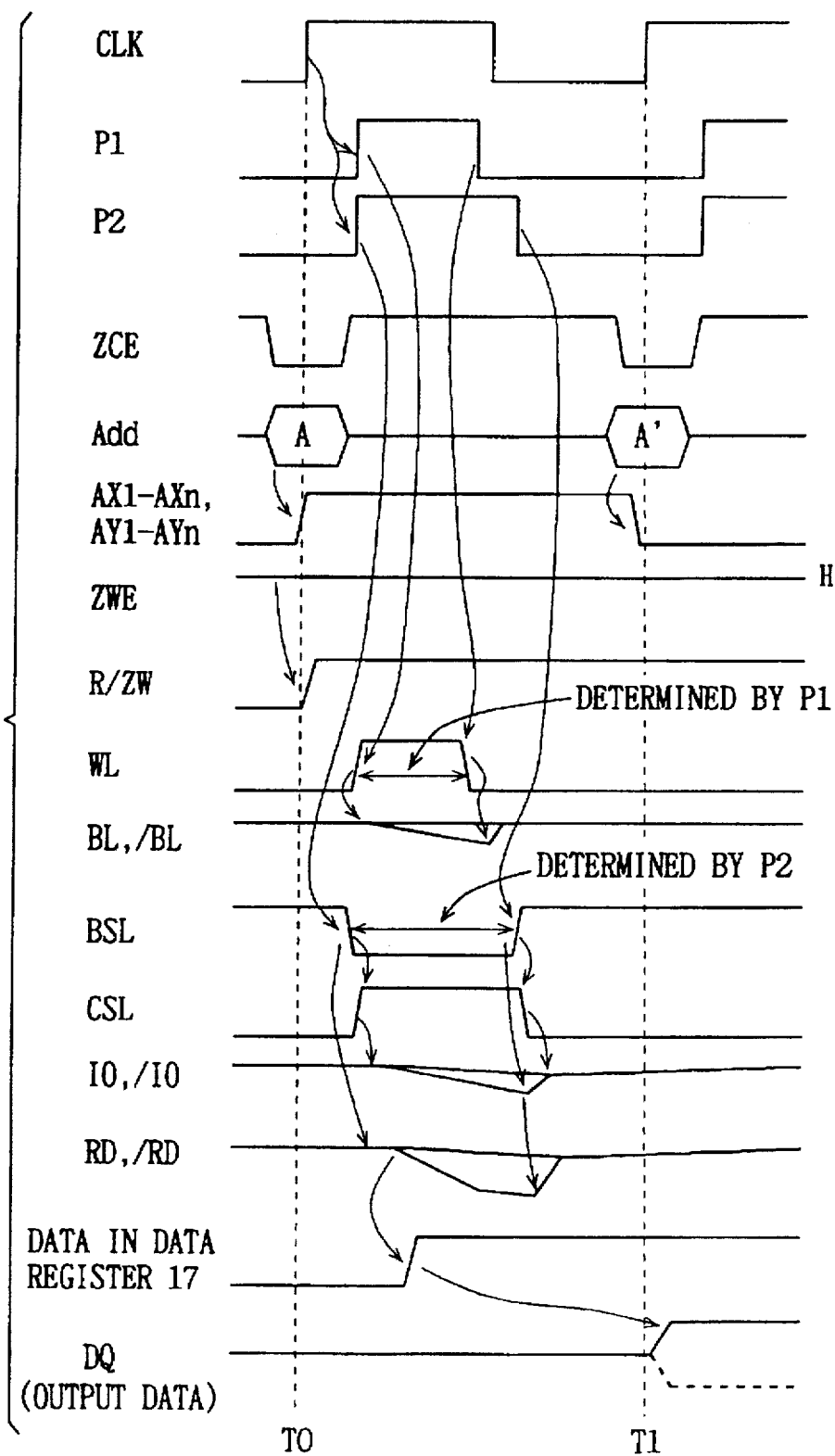
FIG. 11 is a waveform diagram representing a data read operation of the memory device of FIG. 10.

First, an operation in data reading will be described with reference to FIGS. 5, 10 and 11.

At the rising edge of clock signal CLK at time T0, chip enable signal ZCE is set to L level, and the external address signal Add (A) is latched into address register 5, and internal address signal bits AX1–AXn and AY1–AYn are defined and supplied to word line select decoder 8 and bit line select decoder 10.

Write mode designation signal ZWE is at H level, and data read/write mode designation signal R/ZW from mode register 6 goes high at the rising edge of clock signal CLK at time T0. Responsively, NOR circuits 20-2 and 20-3 supply L level signals to the gates of MOS transistors 20-4, 20-8 and 20-6, 20-9 in write driver 20.

After a delay to time T0, internal clock pulses P1 and P2 from clock pulse generator 7 are activated to go high, and word line select decoder 8 and bit line select decoder 10 are enabled to start decoding operation.

When row address signal bits AX1–AXn are all at H level to designate the word line 9, word line drive signal WL goes high, and access transistors 13-1 and 13-2 turn on to couple the storage nodes NA and NB to bit line 12-1 and 12-2, respectively. Bit line potentials BL and /BL precharged at H level of Vcc change in accordance with the potentials at storage nodes NA and NB.

In bit line select decoder 10, block select signal BSL from block decoder 10c goes low when block address signal bits (most significant Y address signal bits) designate the memory block. Unit column decoder 10b is enabled to decode column address signal bits (least significant Y address signal bits) AY1–AYl and drives the column select signal CSL to H level when column address signal bits AY1–AYl designate the shown bit lines 12-1 and 12-2.

On the other hand, in sense amplifier 16, the output signal of NOR circuit 16-1 goes high to deactivate the inverters 20a and 20b in write driver 20 and to activate the differential sense amplifier 16a by turning on the current source MOS transistor 16-3.

Internal data input/output lines 15-1 and 15-2 precharged to H level by write driver 20 are coupled to bit lines 12-1 and 12-2 through bit line select transfer gate transistors 11-1 and 11-2 made conductive in response to column select signal CSL at H level.

Potentials IO and /IO change in accordance with bit line potentials BL and /BL, and differentially amplified by sense amplifier 16 (differential amplifier 16a) to produce internal read data signals RD and /RD. Amplified data signals RD and /RD are latched by data register 17.

When predetermined times pass, internal clock signals P1 and P2 from clock pulse generator 7 go low sequentially. Responsively, word line select decoder 8 and bit line select decoder 10 are disabled, and word line drive signal WL is deactivated to go low, block select signal BSL is deactivated to go high, and column select signal CSL goes low.

Thus, memory cell 13 is disconnected from bit lines 12-1 and 12-2, which in turn are isolated from internal data input/output lines 15-1 and 15-2. Output signal of NOR circuit 16-1 goes low to deactivate the differential amplifier 16a and to turn on MOS transistors 20-5 and 20-7 in inverters 20a and 20b.

Bit lines 12-1 and 12-2 are precharged to H level by bit line load 14, and internal data input/output lines 15-1 and 15-2 are precharged to H level of Vcc level through p channel MOS transistors 20-4, 20-5 and 20-6, 20-7, respectively.

Although internal read data signal RD and /RD are restored to H level, data latched in data register 17 does not change, because of the use of NAND type flipflop therein.

At time T1, clock signal CLK rises, and data in data register 17 is applied to data input/output terminal 19 through output buffer 18.

Activation period of internal clock pulse P1 is made shorter than that of internal clock pulse P2. Internal data input/output lines 15-1 and 15-2 each provided in common for the bit lines in the memory block, and has a relatively large parasitic (line) capacitance as compared to bit lines 12-1 and 12-2. Therefore, even when word line 9 is brought into non-selected state by internal clock pulse P1 and bit lines 12-1 and 12-2 are precharged by bit line load 14, the potentials IO and /IO maintains the potential difference. Thus, sense amplifier 16 has a sufficient time to sense and amplify the potential difference, and data can be correctly read out.

Figure 12:
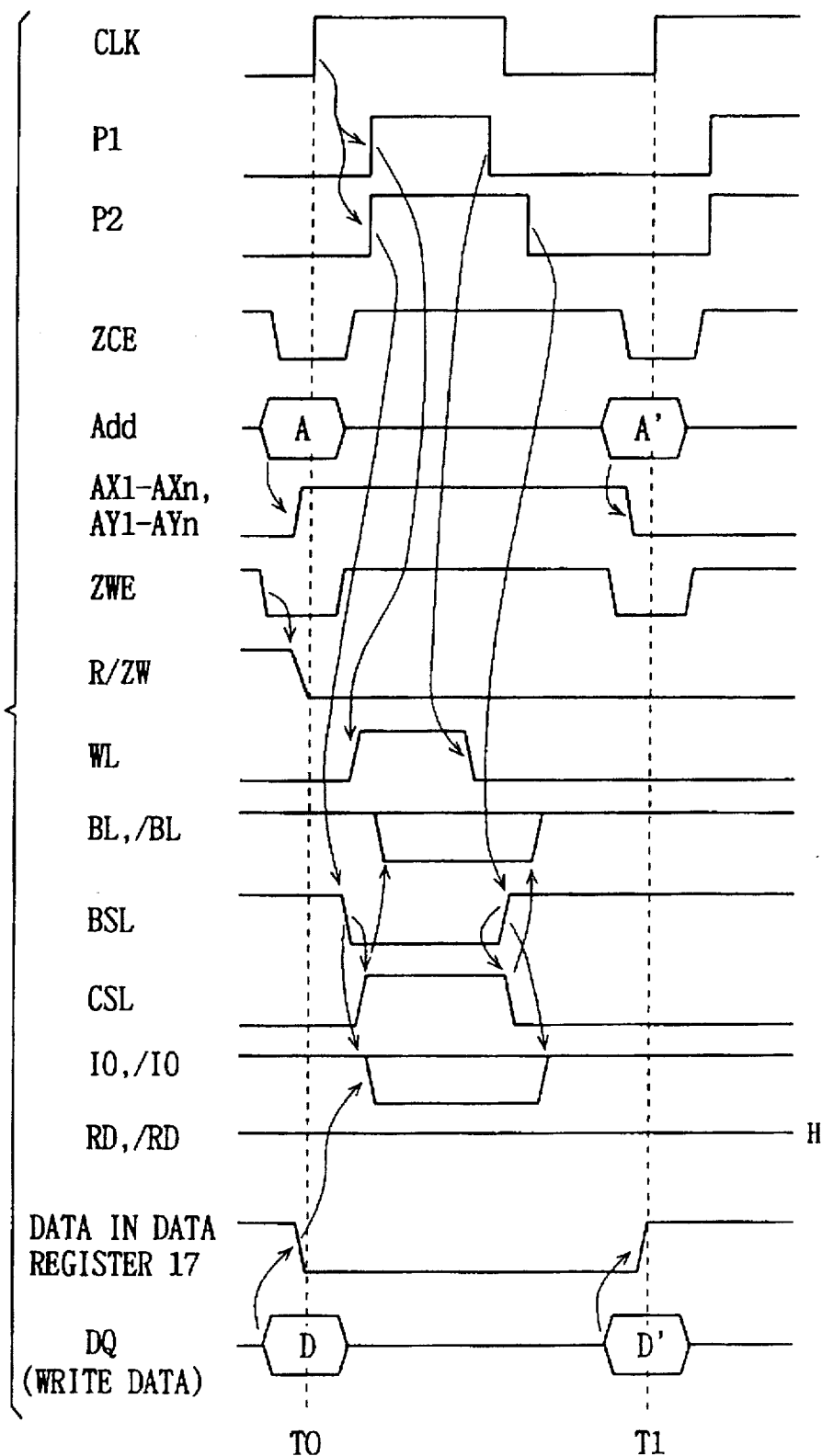
FIG. 12 is a waveform diagram representing a data write operation of the memory device of FIG. 10.

Now, data write operation will be described with reference to the generation waveform diagram of FIG. 12 as well as FIGS. 5 and 10.

Before time T0, chip enable signal ZCE and data write mode designation signal ZWE are set to L level, and write data D is applied to the terminal 19.

At the rising edge of clock signal CLK at time T0, address signal Add is latched into address register 5, and data read/write mode designation signal R/ZW is made low. Also, write data D is latched into data register 17.

As in the data read operation, internal clock pulses P1 and P2 rises, and word line drive signal WL is driven to H level by word line select decoder 8 in accordance with row address signal bits AX1–AXn, block select signal BSL is driven to L level by block decoder 10c in accordance with block address signal bits AYm–AYn, and column select signal CSL is driven to H level by column decoder 10b in accordance with block select signal BSL and column address signal bits AY1–AY1.

The signal R/ZW is at L level, and sense amplifier 16 is in an inactive state and the read out data signals RD and /RD are at H level as in a non-selected or standby state.

In write driver 20, NOR circuits 20-2 and 20-3 are enabled by the signals R/ZW and BSL, and generate data signals corresponding to write data latched in data register 17 for application to inverters 20a and 20b. Inverters 20a and 20b are enabled by the output signal at L level from NOR circuit 16-1 in sense amplifier 16, and drive the internal data input/output lines 15-1 and 15-2 precharged at H level of Vcc level to the H and L levels corresponding to the output signals of NOR circuits 20-2 and 20-3.

The potentials IO and /IO are transferred to storage nodes NA and NB of memory cell 13 through bit lines 12-1 and 12-2 coupled to the input/output lines 15-1 and 15-2 through bit line select transfer gate 11 made conductive in response to column select signal CSL.

When predetermined times have passed from the rising of clock signal CLK, internal clock pulses P1 and P2 from clock pulse generator 7 are made low sequentially. When word line drive signal WL goes low in response to internal clock pulse P1 and memory cell 13 is disconnected from bit lines 12-1 and 12-2, word driver 20 is still active to drive the bit lines 12-1 and 12-2 through bit line select transfer gate 11, and therefore data can be reliably written into the selected memory cell 13.

When internal clock pulse P2 goes low, bit line select transfer gate 11 is made non-conductive, and word driver 20 is deactivated. Internal data input/output lines 15-1 and 15-2 are isolated from bit lines 12-1 and 12-2, and precharged to H level by word driver 20. Bit lines 12-1 and 12-2 are also precharged to H level through bit line load 14.

At time T1, chip enable signal ZCE and data write mode designation signal ZWE are set at L level, and data writing operation in accordance with write data D' and address signal Add (A') is performed as in the above described manner.

In the embodiment described above, the internal clock pulses P1 and P2 are activated during a period shorter than the cycle of clock signal CLK. However, if internal activation period (word line selection and bit line selection) is longer than one cycle of clock signal CLK, the activation periods of these internal clock pulses P1 an P2 may be made longer than one cycle of clock signal CLK.

As described above, internal clock pulses shorter than the active period of a selected word line and the operation period of the sense amplifier and the word driver, and column current flowing through bit lines from bit line load, the operating current of the sense amplifier and the through-current from bit lines into the write driver can be reduced, and a memory device with low current consumption is implemented.

FIG. 13 shows a modification of the embodiment according to the present invention. Referring to FIG. 13, a latch circuit 30 which is responsive to internal clock pulse P1 for latching internal read data signals RD and /RD is provided between sense amplifier 16 and an output register 17a included in data register 17.

Latch circuit 30 includes a transfer gate circuit 30a responsive to internal clock signal P1 at H level for transferring the data signals RD and /RD, and latches 30b and 30c latching data signals received through transfer gate circuit 30a to supply the latching data RX, /RX to output register 17a. Output register 17a is formed of an up-edge trigger type latch circuit and latches the received data signals RX, /RX in response to the rise of clock signal CLK.

FIG. 14 is an operation waveform diagram for describing the meritorious effect of the arrangement of FIG. 13.

Referring to FIG. 13, at time T0, internal clock pulses P1 and P2 rise, and word line drive signal WL, block select signal BSL and column select signal CSL are raised to H level. Internal data input/output line potentials IO, /IO change in accordance with not shown bit line potentials, and internal read data signals RD and /RD are produced from sense amplifier 16.

Transfer gate circuit 30a is made conductive in response to internal clock pulse P1, and the data signals RD and /RD are latched by the latches 30b and 30c.

At time T1, internal clock pulse P1 falls to L level while internal clock pulse P2 is still at H level. Under this state, word line drive signal WL goes low, and memory cell is isolated from the bit lines. Bit line load supplies the current flow to internal data input/output lines. Thus, there is a possibility that the potentials IO,/IO slightly rise and the difference thereof becomes small as shown by a dotted line. Sense amplifiers 26 is still active and the data signals RD, /RD may change due to the very small difference between the potentials IO, /IO.

However, transfer gate circuit 30a in latch circuit 30 is turned off in response to internal clock pulse P1 at L level at time T1. Thus, the signals RX and /RX are reliably latched without any influence of the variation of the potentials IO and /IO. Output register 17a latches the data signals RX and /RX in response to the rise of clock signal CLK. Thus, correct data can be reliably output through the output buffer.

At time T2, internal clock pulse P2 goes low, and block select signal BSL and column select signal CSL go low, and the potentials IO, /IO and the signals RD, /RD are precharged to H level.

Thus, due to the provision of the latch responsive to the internal clock pulse determining the word line activation period between the sense amplifier and the data register (output register), data can be transferred to and latched by the date register without any adverse influence of shortening of word line activation period.

Figure 15:
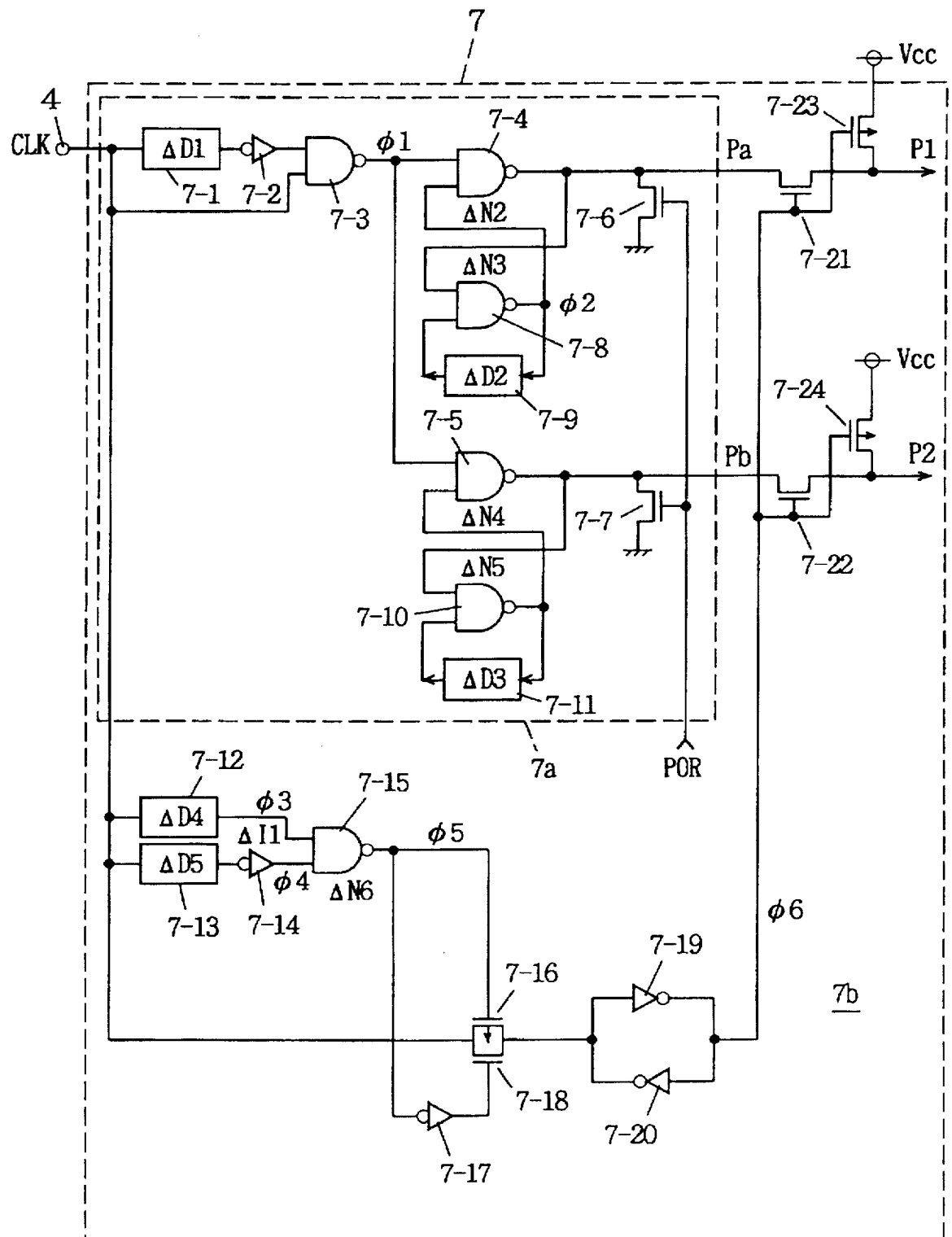
FIG. 15 shows another embodiment of the clock pulse generator shown in FIG. 5.

FIG. 15 shows another embodiment of clock pulse generator. Referring to FIG. 15, clock pulse generator 7 includes a clock pulse generating circuit 7a for generating clock pulses Pa and Pb in synchronization with clock signal CLK, and a clock switching circuit 7b for switching frequencies of internal clock pulses P1 and P2 in accordance with a frequency of clock signal CLK.

Clock pulse generating circuit 7a has the same configuration as that of clock pulse generator shown in FIG. 6. The detailed description of the circuit 7a will be omitted, and corresponding components are allotted with like reference numerals.

Pulses Pa and Pb are activated for predetermined periods in response to rising of clock signal CLK.

Clock switching circuit 7b includes a delay circuit 7-12 receiving and delaying by a delay time of $\Delta D4$ the clock signal CLK, a delay circuit 7-13 receiving and delaying by a delay time of $\Delta D5$ the clock signal CLK, a NOT circuit 7-14 having a delay time of $\Delta I1$ and inverting an output signal of delay circuit 7-13, a NAND circuit 7-15 having a delay time of $\Delta N6$ and receiving an output signal $\phi 3$ of delay circuit 7-12 and an output signal $\phi 4$ of NOT circuit for performing NAND (negative logical product) operation on the received signals $\phi 3$ and $\phi 4$ to produce an output signal $\phi 5$. Delay time $\Delta D4$ of delay circuit 7-12 is made shorter than the sum of delay time $\Delta D5$ of delay circuit 7-13 and delay time $\Delta I1$ of NOT circuit 7-14.

Clock switching circuit 7b further includes a p channel MOS transistor 7-16 responsive to output signal $\phi 5$ of NAND circuit 7-15 for transferring clock signal CLK, a NOT circuit 7-17 inverting the output signal $\phi 5$, an n channel MOS transistor 7-18 responsive to an output signal of NOT circuit 7-17 for transferring the clock signal CLK, NOT circuits 7-19 and 7-20 constituting an inverter latch to latch the clock signal CLK transferred through MOS transistors 7-16 and 7-18. MOS transistors 7-16 and 7-18 constitutes a CMOS (complementary MOS) transmission gate. NOT circuit 7-19 inverts the clock signal CLK received through MOS transistors 7-16 and 7-18 to produce a clock control signal $\phi 6$.

Clock switching circuit 7b further includes n channel MOS transistors 7-21 and 7-22 responsive to clock control signal $\phi 6$ for transferring the pulses Pa and Pb to produce internal clock pulses P1 and P2, respectively, and p channel MOS transistors 7-23 and 7-24 responsive to clock control signal $\phi 6$ for being made conductive complementarily to MOS transistors 7-21 and 7-22 to fix the clock pulses P1 and P2 to H level. Now, operation of the clock pulse generator 7 of FIG. 15 will be described with reference to timing charts of FIGS. 16A and 16B.

Operation of clock pulse generating circuit 7a is the same as that of clock pulse generator 7 shown in FIG. 6, and description of the operation of the circuit 7a is omitted.

Figure 16A:
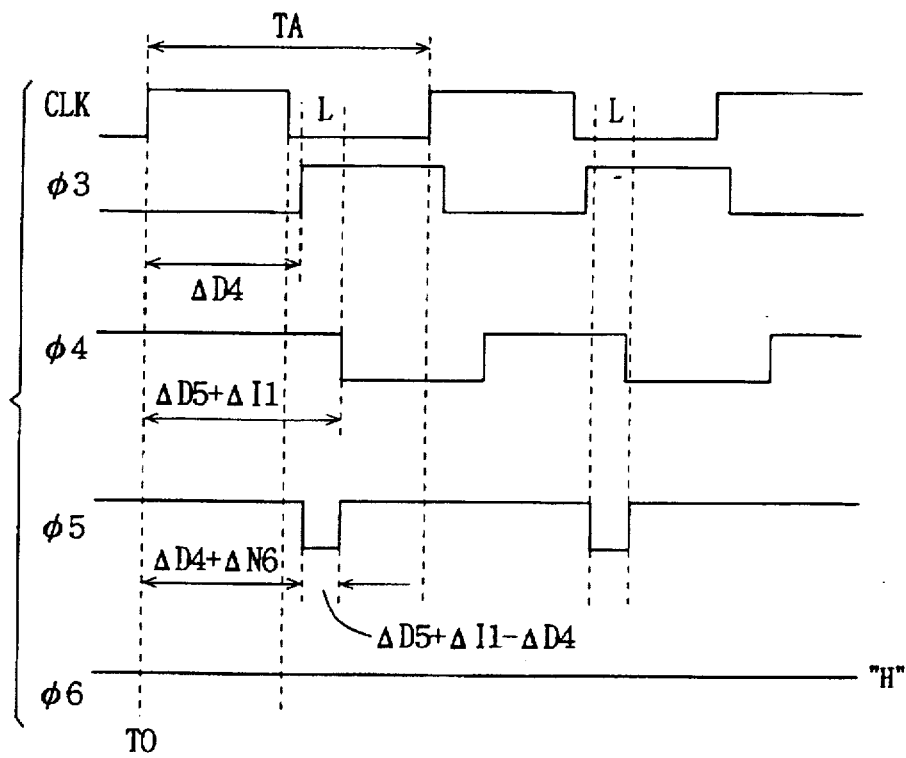
FIGS. 16A and 16B are waveform diagrams representing the operations of the clock pulse generator shown in FIG. 15.

First, an operation in the case of a relatively low frequency of clock signal CLK will be described with reference to FIG. 16A. When clock signal CLK rises to H level at time T0, the signal $\phi 3$ from delay circuit 7-12 rises at time T0+$\Delta D4$, and the signal $\phi 4$ from NOT circuit 7-14 falls from H level to L level at time T0+$\Delta D5$+$\Delta I1$. Since delay time $\Delta D4$ is shorter than delay time $\Delta D5$+$\Delta I1$, the output signal $\phi 5$ from NAND circuit 7-15 is made low from the time IO+$\Delta D4$+$\Delta N6$ for a period of $\Delta D5$+$\Delta I1$−$\Delta D4$ when the signals $\phi 3$ and $\phi 4$ are both at H level.

Responsively, MOS transistors 7-16 and 7-18 are made conductive to transfer the clock signal CLK, and the clock signal CLK is latched by NOT circuits 7-19 and 7-20. It is assumed here that clock signal CLK has a duty ratio of 50% and a cycle time of TA. If TA/2<$\Delta D4$+$\Delta N6$ and TA>$\Delta D5$+$\Delta I1$+$\Delta N6$, clock signal CLK at L level is normally transferred through MOS transistors 7-16 and 7-18 to be latched by NOT circuits 7-19 and 7-20. Therefore, the clock control signal $\phi 6$ is normally at H level, and MOS transistors 7-21 and 7-22 are made conductive while MOS transistors 7-23 and 7-24 are made non-conductive. Thus, pulses Pa and Pb are transferred to be internal clock pulses P1 and P2.

Figure 16B:
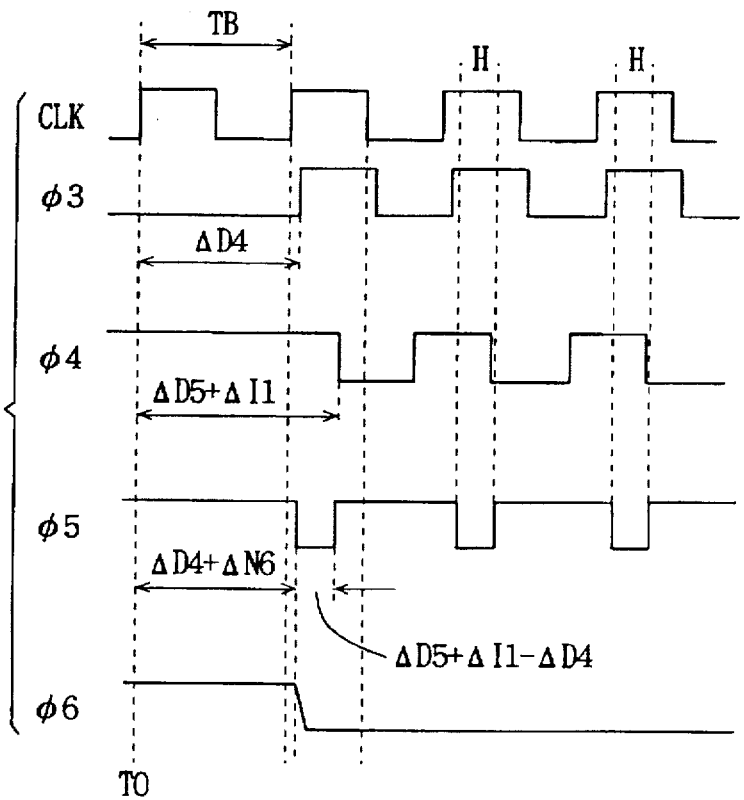

Now, an operation in the case of a relatively high frequency of clock signal CLK will be described with reference to a timing chart of FIG. 16B.

It is assumed here that clock signal CLK has a duty ratio of 50% and a cycle time of TB. When the memory device is powered on, and the power supply voltage is stabilized, the signal $\phi 5$ is at H level. An input of NOT circuit 7-19 is at L level at the initial state and MOS transistors 7-16 and 7-18 are off, and the clock control signal $\phi 6$ is at H level.

When clock signal CLK is applied and rises to H level at time T0, the signal $\phi 5$ falls to L level at time T0+$\Delta D4$+$\Delta N6$, clock signal CLK at H level is transferred through MOS transistors 7-16 and 7-18 to be latched by NOT circuits 7-19 and 7-20, and the clock control signal $\phi 6$ goes low. Responsively, n channel MOS transistors 7-21 and 7-22 are turned off, and p channel MOS transistors 7-23 and 7-24 are turned on. Thus, internal clock pulses P1 and P2 are set at H Level.

If TB<$\Delta D4$+$\Delta N6$ and 3·TB/2>$\Delta D5$+$\Delta I1$+$\Delta N6$, the signal $\phi 5$ from NAND circuit 7-15 normally goes low when clock signal CLK is at H level, the clock control signal $\phi 6$ is normally at L level, and internal clock pulses P1 and P2 are fixed at H level irrespective of the levels of pulses Pa and Pb.

Word line select decoder 8 and bit line select decoder 10 shown in FIG. 10 are not clocked under this state, and operate statistically in accordance with address signal bits received from the address register.

Clock pulse generating circuit 7a has a finite frequency response characteristic, and may not follow the clock signal CLK if the clock signal CLK has a very high frequency. In this state, the pulses P1 and P2 (Pa and Pb) are not defined or the clock pulse generating circuit is brought into an oscillating state. In such a state, word line select decoder and bit line select decoder are not correctly clocked, if the clock switching circuit 7b is not provided.

Even if the circuit 7a can follow the clock signal CLK, there may be a case where internal clock pulses are activated over a plurality of operation cycles (or clock cycles), and no correct clocking operation can be implemented.

Even if internal clock pulses P1 and P2 are correctly generated under fast clock signal CLK, word line select decoder and bit line select decoder are clocked at high speed in response to the fast internal clock pulses, and switching current (AC current) is increased although DC current, or column current, sense amplifier operating current and word driver through-current are reduced.

As shown in FIG. 15, due to the provision of clock switching circuit 7b, the disadvantages as described above are all eliminated.

Meanwhile, in the arrangement of FIG. 15, the clock control signal φ6 may be applied to an input of NAND circuit 7-3 to fix the signal φ1 at H level for clock signal CLK of a high frequency. Pulses Pa and Pb do not change the potential levels, and current consumption is reduced.

Figure 17:
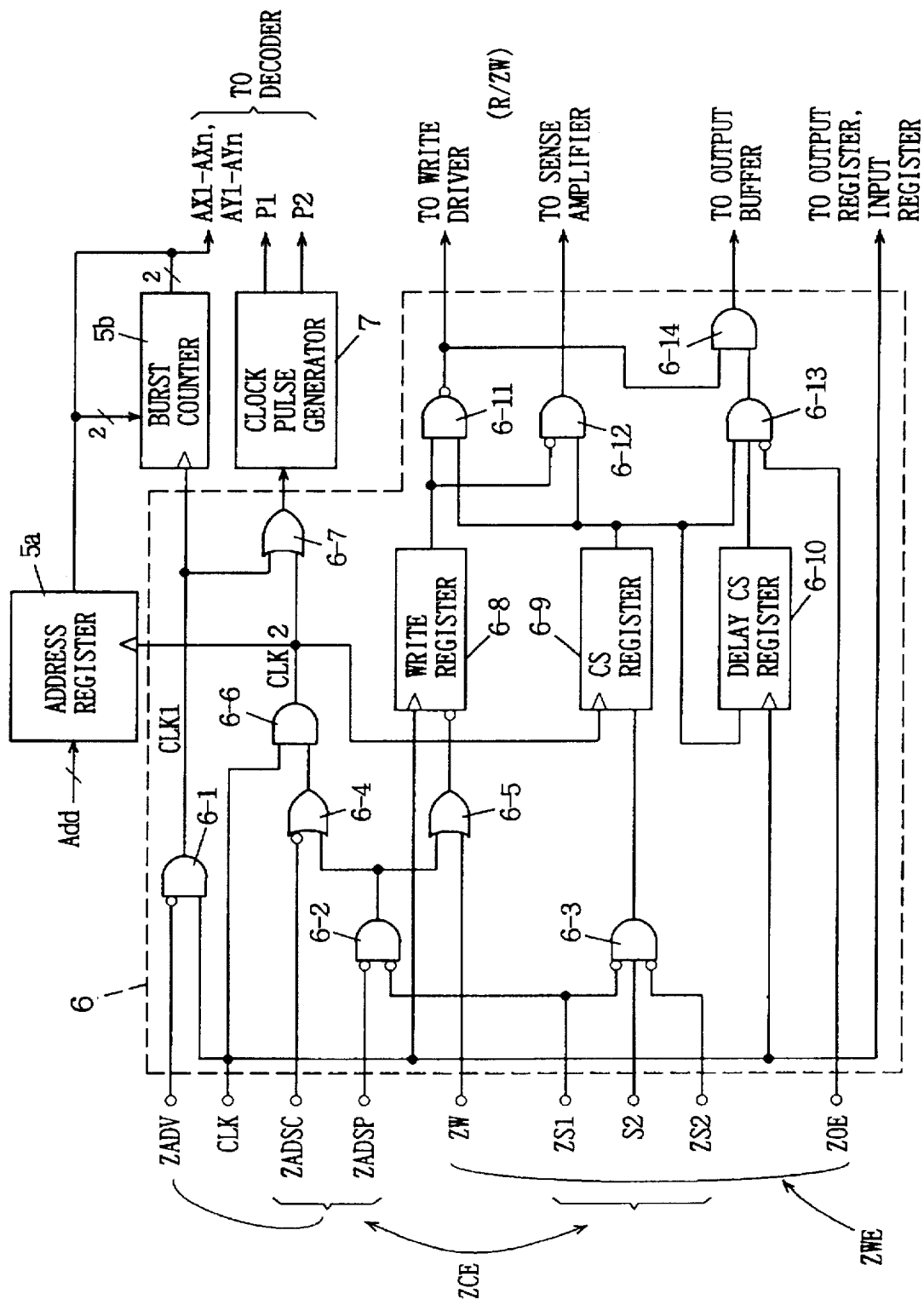
FIG. 17 shows a specific arrangement of the mode register of FIG. 5.

FIG. 17 shows a further embodiment of the present invention, and particularly shows an arrangement of mode register 6 in detail.

Referring to FIG. 17, mode register 6 includes a logic gate 6-1 receiving an address advance signal ZADV and an external clock signal CLK to generate a first internal clock signal CLK1, a NOR gate 6-2 receiving an address status processor signal ZADSP and a first chip select signal ZS1, a logic gate 6-3 receiving first chip select signal ZS1 and complementary second chip select signals S2 and ZS2, a logic gate 6-4 receiving an address status controller signal ZADSC and an output signal of NOR circuit 6-2, an OR gate 6-5 receiving a write enable signal ZW and an output signal of NOR gate 6-2, an AND gate 6-6 receiving external clock signal CLK and an output signal of logic gate 6-4 to generate a second internal clock signal CLK2, and an OR gate 6-7 receiving first and second internal clock signals CLK1 and CLK2.

Address advance signal ZADV designates an advance of an internal address in a burst mode. Address status controller signal ZADSC indicates that an access is requested by an external memory controller. Address status processor signal ZADSP indicates that an access is requested by an external processor. Write enable signal ZW indicates that data write operation is designated. Output enable signal ZOE indicates that data reading operation is designated. Chip select signals ZS1, S2 and ZS2 indicate that the chip (memory device) is selected, or the chip is requested of accessing. The use of chip select signals ZS1, S2 and ZS2 enables wired OR connection of output terminals of memory devices.

Chip select signals ZS1, S2 and ZS2, address status controller signal ZADSC, address status processor signal ZADSP, and address advance signal ZADV correspond to chip enable signal ZCE. Write enable signal ZW and output enable signal ZOE correspond to write mode designation signal ZWE.

Address register 5 includes an address register 5a for receiving and latching an address signal Add in synchronization with the rise of second clock signal CLK2, and a burst counter 5b latching two and outputting least significant address signal bits from address register 5a and advancing the latched address in response to the rise of first clock signal CLK1.

Clock pulse generator 7 receives the output signal of OR gate 6-7, or first and second clock signals CLK1 and CLK2 to generate the internal clock pulses P1 and P2.

Mode register 6 further includes a write register 6-8 responsive to the rise of clock signal CLK for incorporating and latching an inverted version of the output signal of OR gate 6-5, a CS (chip select) register 6-9 responsive to the rise of second internal clock signal CLK2 for incorporating and latching the output signal of logic gate 6-3, a delay CS register 6-10 responsive to the rise of clock signal CLK for incorporating and latching an output signal of CS register 6-10.

The registers 6-8 through 6-10 each are formed of an up-edge trigger type latch. Delay CS register 6-10 latches the output signal preceding by one clock cycle of CS register 6-9 because clock signal CLK changes at an earlier timing than second internal clock signal CLK2.

Mode register 6 further includes a NAND gate 6-11 receiving outputs of the registers 6-8 and 6-9 to produce a control signal driving the write driver, a logic gate 6-12 receiving the output signal of write register 6-8 at a false input thereof and the output signal of CS register 6-9 at a true input thereof to produce a sense amplifier driving signal, a logic gate 6-13 receiving the output signals of the registers 6-9 and 6-10 at true inputs thereof and output enable signal ZOE at a false input thereof, and an NAND gate 6-14 receiving the output signal (write driver driving signal) of NAND gate 6-11 and an output signal of logic gate 6-13 to produce an output buffer driving signal. Data register 17 (input register and output register) operate in response to clock signal CLK to latch applied data signals. Now, operation of the circuitry will be described with reference to timing charts of FIGS. 18 and 19.

Figure 18:
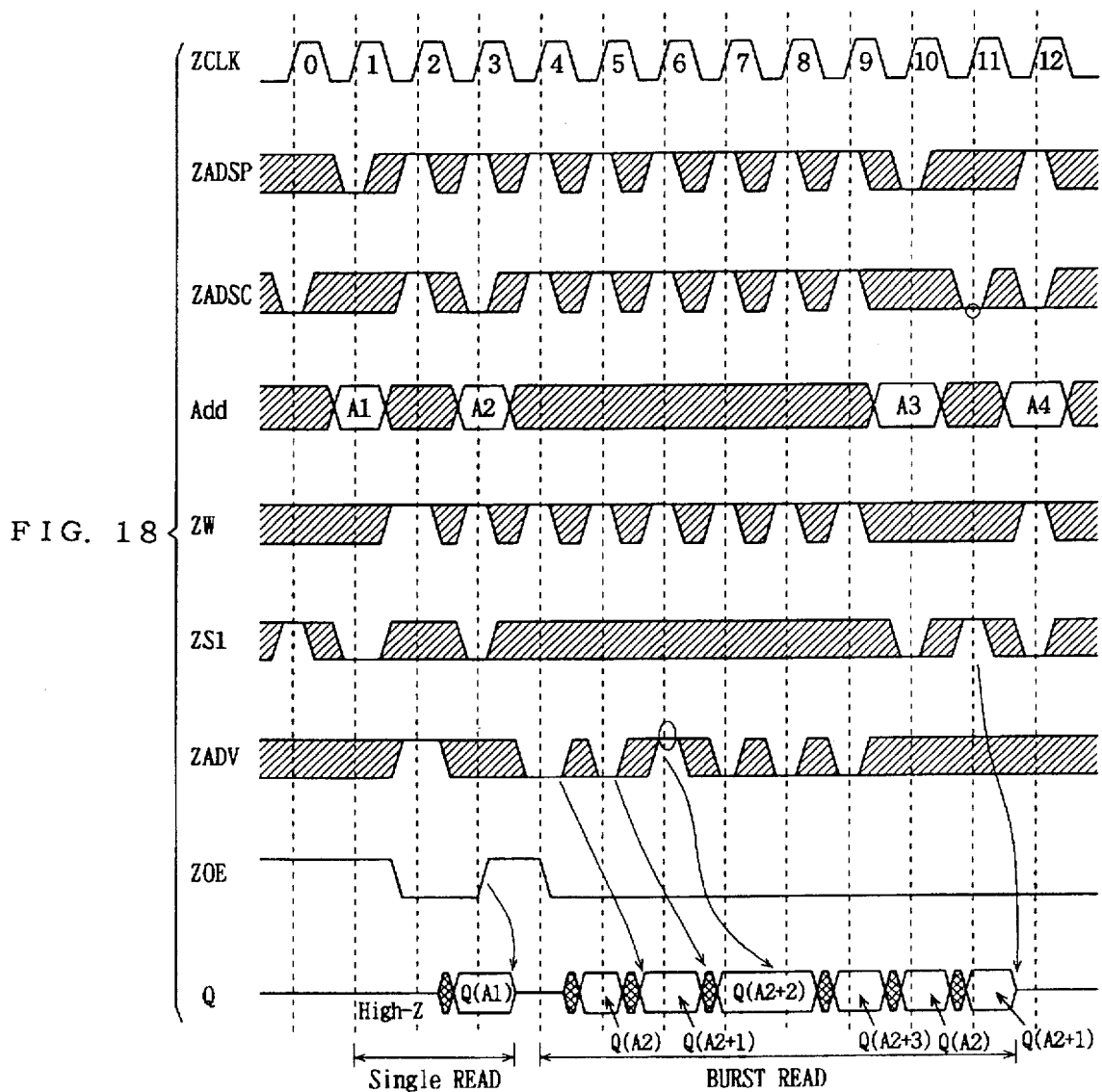
FIG. 18 is a timing chart showing the states of external signals shown in FIG. 17 in a data reading operation.
Figure 19:
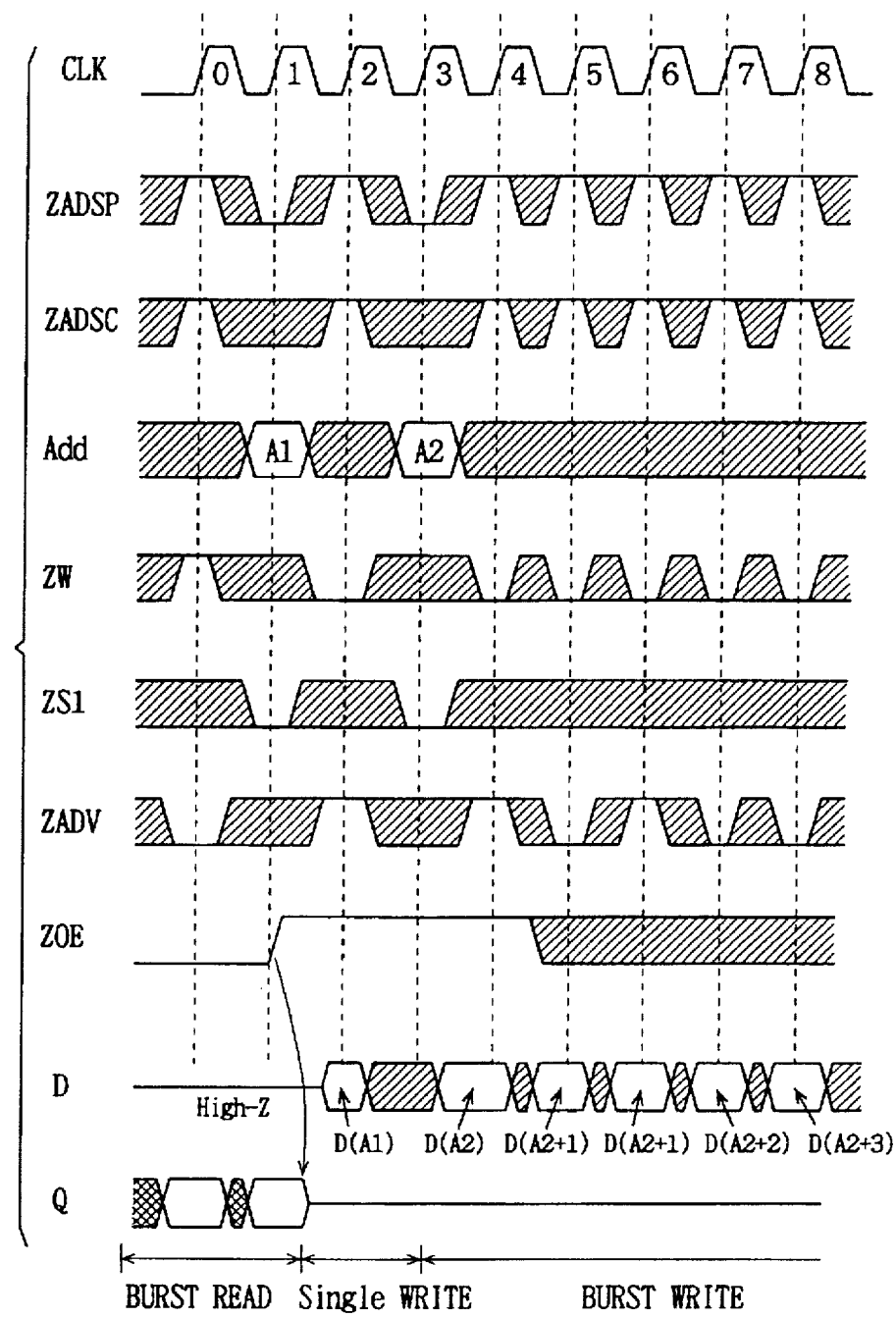
FIG. 19 is a timing chart showing the states of the external signals shown in FIG. 17 in a data write operation.

In FIGS. 18 and 19, first chip select signal ZS1 among chip select signals ZS1, S2 and ZS2 is representatively shown. However, the chip select signals S2 and ZS2 are set in correspondence to first chip select signal ZS1. That is, when ZS1=L, ZS2 and S2 are set to L and H levels, respectively. When ZS1=H, ZS2 and S2 are set to H and L levels, respectively.

First, data read operation will be described with reference to FIGS. 17 and 18.

At clock cycle 0, the signal ZADSC is set low and chip select signal ZS1 is set high. Logic gate 6-4 supplies an H level signal to AND circuit 6-6 which in turn passes the clock signal CLK to generate the second internal clock Signal CLK2. Address signal Add is latched into address register 5a, and clock pulse generator 7 generates the clock pulses P1 and P2 in response to the second clock signal CLK2. However, CS register 6-9 latches an L level signal from logic gate 6-3 in synchronization with second internal clock signal CLK2, to inhibit the operation of sense amplifier and write driver. Output enable signal ZOE is at H level, and the output signals of the gates 6-13 and 6-14 are at L level, and the output buffer is set in the output high impedance state (High-Z).

At clock cycle 1, the signals ZADSP and ZADSC are both set to L level, and the output signal of the gate 6-2 goes high, and responsively the output signals of the gates 6-4 and 6-5 go high. Second clock signal CLK2 is generated, and address signal Add (A1) is latched into address register 5a, and CS register 6-9 latches the H level signal from the gate 6-3 in synchronization with the clock signal CLK2. Clock pulses P1 and P2 are generated and memory cell selection operation is performed.

At clock cycle 2, the signals ZADSP, ZADSC, ZW and ZADV are set at H levels, and the logic gate 6-4 supplies an L level signal to inhibit the generation of second internal clock signal CLK2, and logic gate 6-1 is disabled to inhibit the generation of first internal clock signal CLK1. Address register 5a and burst counter 5b supply the address signal bits AX1–AXn and AY1–AYn latched in the clock cycle 1.

Write register 6-8 latches the output signal at H level from OR gate 6-5 in synchronization with clock signal CLK to supply an L level signal. CS register 6-9 latches the H level signal latched in the clock cycle 1, and NAND gate 6-11 supplies an H level signal to inhibit the operation of the write driver, and the gate 6-12 supplies an H level signal to activate the operation of the sense amplifier. Output enable signal ZOE is at L level, and delay CS register 6-10 latches the H level signal from CS register 6-9 in synchronization with clock signal CLK, and AND gate 6-14 supplies an H level signal to enable the output buffer. Thus, data Q (A1) at address A1 is read out through the output register and output buffer, and latched by the output register at the rise of clock signal CLK at the clock cycle 3. When output enable signal ZOE is made high, AND gate 6-14 supplies an L level signal to bring the output buffer into output high impedance state.

At clock cycle 3, the signals ZADSP and ZW are set to H level, and the signals ZADSC and ZS1 are set to L level. NOR gate 6-2 supplies an L level signal, and logic gate 6-4 supplies an H level signal, and the internal clock signal CLK2 is generated, and address signal Add is latched into address register 5a. Burst counter 5b receives two least significant Y address signal bits, and latches and outputs the same.

Write register 6-8 latches the output signal at H level in synchronization with clock signal CLK to supply an L level signal. Chip select signal ZS1 is at L level, and the gate 6-3 supplies an H level signal, and CS register 6-9 latches the H level signal received from the gate 6-3 in response to the rise of the second internal clock signal CLK2. Thus, the gate 6-12 supplies an H level signal to operate the sense amplifier. Memory cell is selected in accordance with address signal bits AX1–AXn and AY1–AYn. Output enable signal ZOE is at H level, and the output buffer is at output high impedance state.

At clock cycle 4, the signals ZADV, ZADSC and ZW are set at H level, and the second clock signal CLK2 is maintained at L level, and the contents of address register 5a and CS register 6-9 are not changed. Write register 6-8 latches an H level signal to supply an L level signal. Delay CS register 6-10 latches the H level signal from CS register 6-9 in response to the rise of clock signal CLK. Address advance signal ZADV is at L level, and burst counter 5b advances the latched address in response to the first internal clock signal CLK1. Thus, a new memory cell is selected.

At clock cycles 4, 5 and 6, output buffer is enabled in response to H level signal from AND gate 6-14, and data Q (A2) addressed by the address A2 and data Q (A2+1) and Q (A2+2) addressed by the advanced addresses are read out through the output buffer, and are made valid at the rise of clock signal CLK of clock cycles 5, 6 and 7.

At clock cycle 7, address advance signal ZADV is set to H level, and first clock signal CLK1 is not generated. Burst counter 5b does not advance the latched address, and memory cell data at address "A2+2" is again read out. Clock pulses P1 and P2 are not generated, and the output register continuously supplies the data Q (A2+2) in the cycle 7.

At clock cycles 8 and 9, address advance signal ZADV is made low to advance the address in the burst counter 5b in response to the first internal clock signal CLK1. Clock pulses P1 and P2 are generated in response to the first internal clock signal CLK1, and memory cell selection is performed, although the second internal clock signal CLK2 is not generated. Thus, data Q(A2+3), Q(A2) and Q (A2+1) are sequentially read out.

At clock cycle 10, the signals ZADSP and ZS1 are set at L level, and second internal clock signal CLK2 is generated and a new address A3 is latched into address register 5a.

At clock cycle 11, chip select signal ZS1 is set to H level, and address 5a is updated. CS register 6-9 supplies an L level signal to inhibit the operation of write driver and sense amplifier, and to bring the output buffer into output high impedance state.

At clock cycle 12, the signals ZADSP and ZW are set to H level, and the signals ZADSC and ZS1 are set to L level, and data read operation in accordance with the address A4 is performed.

Memory cell is selected in one clock cycle and the selected memory cell data is read out in one clock cycle. Only when memory cell is selected, internal clock pulses P1 and P2 are generated and unnecessary generation of internal clock pulses P1 and P2 can be inhibited, and current consumption is reduced.

Now, data write operation will be described with reference to FIG. 19.

At clock cycles 0 and 1, data are read sequentially.

At clock cycle 1, output enable signal ZOE is set to H level, and the output buffer is set to output high impedance state. The signals ZADSP and ZS1 are set to L level, and address A1 is latched into address register 5a in response to second internal clock signal CLK2, and H level signal is latched in CS register 6-9.

At clock cycle 2, the signals ZADSP and ZADSC are set to H level to inhibit generation of second internal clock signal CLK2. The signal ZADV is at H level, and write enable signal ZW is set to L level. According to the address A1, memory cell is selected and data D (A1) is written into the selected memory cell at address A1 in the cycle 2.

At clock cycle 3, the signals ZADSP and ZS1 are set to L level, and an address A2 is latched in address register 5a.

At clock cycle 4, the signals ZADSP, ZADSC and ZADV are set to H level, and the signal ZW is set to L level. Memory cell at address A2 is selected and data D (A2) is written into the selected memory cell.

At clock cycle 5, address advance signal ZADV and write enable signal ZW are set to L level, and burst counter 5b advances the latched address, and data D (A2+1) is written into the memory cell at the advanced address A2+1. In this cycle 5 the clock signal CLK1 is generated.

At clock cycle 6, the signal ZADV is set to H level, and the signal ZW is set to L level, burst counter 5b does not advance the address, and memory cell at address A2+1 is selected again.

At clock cycles 7 and 8, the signals ZADV and ZW are set to L level, and address is advanced and data D (A2+2) and D (A2+3) are written into the memory cells at the advanced addresses, respectively.

In the data writing in a burst mode, the address advance signal ZADV is set to L level and first internal clock signal CLK1 is generated.

In the single data writing, the signal ZADV is set to H level, and the first internal clock signal CLK1 is not generated. Signals ZADSP and ZADSC are used to update an address latched in the address register 5a.

Figure 20:
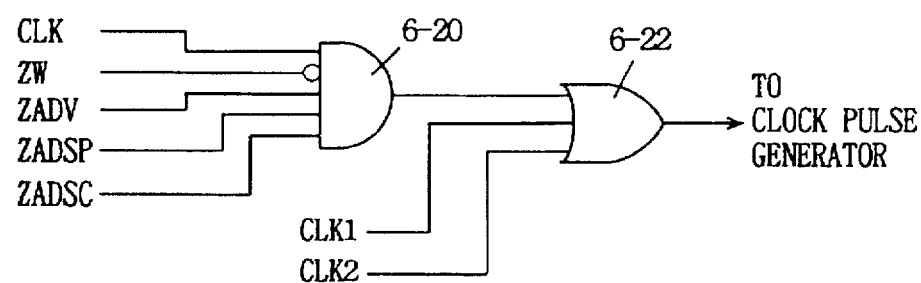
FIG. 20 shows a modification of logic gate controlling the generation of internal clock pulses.

In order to reliably generate clock pulses P1 and P2 in a single write mode of operation, the construction of FIG. 20 is employed.

Referring to FIG. 20 a logic gate 6-20 receives the signals CLK, ZW, ZADV, ZADSP and ZADSC and generate an H level signal when only write enable signal ZW is at L level and the other signals CLK, ZADV, ZADSP and ZADSC are all at H level OR gate 6-22 receives the output signal of the gate 6-20 and the clock signals CLK1 and CLK2.

Thus, the output signal of OR gate 6-22 is raised whenever an accessing to a memory cell is carried out.

Here, the address bits from the burst counter are used to select a column.

In addition, in the arrangement of FIG. 17, the output signal of OR gate 6-7 (or OR gate 6-22 of FIG. 20) is a trigger signal, and the one shot pulse generator formed of delay circuit 7-1, NOT circuit 7-2 and NAND circuit 7-3 in the clock pulse generator 7 as shown in FIG. 17 can be removed. The frequency switching circuit 7b shown in FIG. 15 receives the external clock signal CLK.

According to the arrangement of FIG. 17, internal clock pulses P1 and P2 are generated only when a memory cell is accessed, and unnecessary current consumption in a standby state can be avoided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device incorporating external signals including an address signal in synchronization with a clock signal applied periodically regardless of whether an access is made to said semiconductor memory device, comprising:

a memory array including a plurality of memory cells arranged in rows and columns;

accessing means responsive to an address signal and an operation mode designation signal generated internally in accordance with the external signals in synchronization with said clock signal for selecting a memory cell in said memory array and performing either data reading or data writing on the selected memory cell; and clock pulse generator for generating a plurality of clock pulses having different activation periods from each other in synchronization with a one-time transition at a common time of said clock signal, to apply the clock pulses to said accessing means for activation thereof.

2. The semiconductor memory device according to claim 1, wherein said plurality of clock pulses each have an activation period shorter than operation cycle of said semiconductor memory device in which data read or write data to the selected memory cell is completed.

3. The semiconductor memory device according to claim 2, wherein said operation cycle is one cycle of said clock signal.

4. The semiconductor memory device according to claim 1, wherein said accessing means includes, a word line select decoder receiving and decoding a first address signal in said address signal for selecting a row in said rows, and a bit line select decoder receiving and decoding a second address signal in said address signal for selecting a column in said columns, and said clock pulse generator includes first generator for generating and applying a first clock pulse having a first activation period to said word line select decoder for enabling thereof, and second generator for generating and applying a second clock pulse having a second activation period longer than said first activation period to said bit line select decoder for enabling thereof.

5. The semiconductor memory device according to claim 4, wherein said accessing means further includes a sense amplifier coupled to receive data of the memory cell on the row and the column selected by said word line select decoder and said bit line select decoder for amplifying the received data to produce internal read data when activated by said operation mode designating signal designating a data read operation, and said clock pulse generator includes circuitry for generating a clock pulse having an activation period longer than said first activation period to determine an activation period of said sense amplifier.

6. The semiconductor memory device according to claim 5, wherein said sense amplifier is activated during said second activation period.

7. The semiconductor memory device according to claim 5, wherein said accessing means further includes a write driver for writing a data into a memory cell on the row and the column selected by said word line select decoder and said bit line select decoder when activated by said operation mode designation signal designating a data writing operation, and said clock pulse generator includes circuitry for generating a clock pulse having an activation period longer than said first activation period, to determine an activation period of said write driver.

8. The semiconductor memory device according to claim 7, wherein said write driver is activated during said second activation period.

9. The semiconductor memory device according to claim 1, wherein said memory array includes a plurality of blocks of columns, and said accessing means includes, a word line select decoder receiving and decoding a row address signal in said address signal to select a row in said rows, a block decoder receiving and decoding a block address signal in said address signal to select a block in said blocks a column decoder receiving and decoding a column address signal in said address signal to select a column in a memory block selected by said block decoder, and said clock pulse generator includes first means for generating and applying a first clock pulse having a first activation period to said word line select decoder for enabling thereof, and a second means for generating a second clock signal having a second activation period longer than said first activation period for applying the same at least to said block decoder for enabling said block decoder and said column decoder.

10. The semiconductor memory device according to claim 9, wherein said column decoder includes a unit column decoder provided for each column, and only unit column decoders included a memory block selected by said block decoder are enabled of decoding in response to an active block designating signal indicating that the memory block is selected from the block decoder, and only the block decoder receives said second clock pulse.

11. The semiconductor memory device according to claim 9, wherein said accessing means further includes a sense amplifier provided for each memory block and activated by an output signal of said block decoder indicating that a corresponding memory block is selected and said operation mode designation signal indicating a data read operation for amplifying data of the selected memory cell.

12. The semiconductor memory device according to claim 9, wherein said accessing means includes a write driver provided for each memory block and activated by an output signal of the block decoder indicating that a corresponding memory block is selected and said operation mode designation signal indicating a data writing operation for writing data into the selected memory cell.

13. The semiconductor memory device according to claim 1, further comprising
    frequency detection means coupled to receive said clock signal for determining that a frequency of said clock signal is higher than a predetermined frequency, and
    switching means responsive to an output signal of said detection means for fixing said first and second clock pulses to an active state.

14. The semiconductor memory device according to claim 13, wherein said frequency detection means includes,
    delay means coupled to receive said clock signal for delaying the received clock signal,
    one-shot pulse generator responsive to a transition from a first level to a second level of a delayed clock signal from said delay means, for generating a one-shot pulse, and
    a latch coupled to receive said clock signal and responsive to said one-shot pulse signal for incorporating and latching said clock signal to supply the latched clock signal to said switching means as said output signal.

15. The semiconductor memory device according to claim 1, further comprising
    mode register means coupled to receive the external signals other than said address signal, for generating said operation mode designation signal, said mode register means including inhibition gate circuitry responsive to said operation mode designation signal indicating no accessing to said semiconductor memory device for inhibiting generation of said first and second clock pulses.

* * * * *